(12) United States Patent
Ruan et al.

(10) Patent No.: US 11,841,241 B2
(45) Date of Patent: Dec. 12, 2023

(54) SYSTEMS AND METHODS FOR UPDATING A 3D MODEL OF BUILDING

(71) Applicant: BEIJING DIDI INFINITY TECHNOLOGY AND DEVELOPMENT CO., LTD., Beijing (CN)

(72) Inventors: Zhiwei Ruan, Beijing (CN); Zongyue Liu, Beijing (CN); Xiaoqiang Teng, Beijing (CN); Jun Zhang, Beijing (CN); Pengfei Xu, Beijing (CN)

(73) Assignee: BEIJING DIDI INFINITY TECHNOLOGY AND DEVELOPMENT CO., LTD., Beijing (CN)

( * ) Notice: Subject to any disclaimer, the term of this patent is extended or adjusted under 35 U.S.C. 154(b) by 402 days.

(21) Appl. No.: 17/078,087

(22) Filed: Oct. 22, 2020

(65) Prior Publication Data
US 2021/0043003 A1    Feb. 11, 2021

Related U.S. Application Data

(63) Continuation of application No. PCT/CN2018/084736, filed on Apr. 27, 2018.

(51) Int. Cl.
*G01C 21/00* (2006.01)
*G06F 30/13* (2020.01)
(Continued)

(52) U.S. Cl.
CPC ....... *G01C 21/3867* (2020.08); *G01C 21/383* (2020.08); *G01C 21/3841* (2020.08);
(Continued)

(58) Field of Classification Search
CPC ..... G06T 19/00; G06F 30/13; G01C 21/3841; G01C 21/3859; G01C 21/383;
(Continued)

(56) References Cited

U.S. PATENT DOCUMENTS 6,711,287 B1 * 3/2004 Iwasaki .................. G06V 10/56
382/167
7,751,620 B1 * 7/2010 Cosoi .................... H04L 51/212
382/168
(Continued)

FOREIGN PATENT DOCUMENTS

CN          103424113 A      12/2013
CN          104574386 A       4/2015
(Continued)

OTHER PUBLICATIONS

Zvietcovich et al. "A methodology for updating 3D solid models of complex monumental structures based on local point-based meshes," 2013 Digital Heritage International Congress (DigitalHeritage), 2013, pp. 7-14, doi: 10.1109/DigitalHeritage.2013.6743707 (Year: 2013).*

D. Zhao, H. Wang, H. Ma, H. Xu, L. Liu and P. Zhang, "CrowdOLR: Toward Object Location Recognition With Crowdsourced Fingerprints Using Smartphones," in IEEE Transactions on Human-Machine Systems, vol. 47, No. 6, pp. 1005-1016, Dec. 2017, doi: 10.1109/THMS.2017.2700443. (Year: 2017).*

(Continued)

*Primary Examiner* — Charles L Beard
(74) *Attorney, Agent, or Firm* — METIS IP LLC

(57) ABSTRACT

Systems and methods for updating a model of a building are provided. The method includes obtaining a three-dimensional (3D) model of a building including reference environmental data associated with a plurality of reference locations of the building and obtaining current environmental data corresponding to a current location of the building. The method further includes identifying, from the 3D model, a target reference location corresponding to the current location from the plurality of reference locations of the building and comparing the current environmental data with the target reference environmental data. The method further (Continued)

includes sending to the user device the target reference location when the current environmental data match the target reference environmental data, and updating the 3D model with the current environmental data when the current environmental data statistically un-match the target reference environmental data.

18 Claims, 12 Drawing Sheets

(51) Int. Cl.
  *G06T 19/00* (2011.01)
  *G06Q 30/0601* (2023.01)
(52) U.S. Cl.
  CPC ......... *G01C 21/3859* (2020.08); *G06F 30/13* (2020.01); *G06T 19/00* (2013.01); *G06Q 30/0613* (2013.01)
(58) Field of Classification Search
  CPC .. G01C 21/3867; G06V 10/56; G06V 10/751; G06Q 30/0613
  See application file for complete search history.

(56) References Cited

U.S. PATENT DOCUMENTS

| | | | | |
|---|---|---|---|---|
| 7,995,055 | B1* | 8/2011 | Ma | G06V 10/761 |
| | | | | 382/154 |
| 8,705,893 | B1* | 4/2014 | Zhang | G06T 7/33 |
| | | | | 382/285 |
| 8,818,081 | B1* | 8/2014 | Lookingbill | G06T 15/10 |
| | | | | 382/154 |
| 9,091,553 | B2* | 7/2015 | Kotaba | G06T 7/33 |
| 9,224,206 | B1* | 12/2015 | Lookingbill | G06T 7/593 |
| 9,280,815 | B2* | 3/2016 | Slutsky | G06T 19/20 |
| 9,466,143 | B1* | 10/2016 | Walvoord | G06T 7/579 |
| 9,507,885 | B2* | 11/2016 | Yu | G06F 30/13 |
| 9,525,862 | B2 | 12/2016 | Benhimane et al. | |
| 9,648,297 | B1* | 5/2017 | Ettinger | G06T 7/00 |
| 10,109,051 | B1* | 10/2018 | Natesh | G06V 20/10 |
| 10,255,302 | B1* | 4/2019 | Cosic | G06F 3/0481 |
| 10,467,758 | B1* | 11/2019 | Lorenzo | G06T 11/203 |
| 10,482,619 | B2* | 11/2019 | Ebrahimi Afrouzi | G06T 7/30 |
| 10,708,507 | B1* | 7/2020 | Dawson | H04N 23/695 |
| 10,825,243 | B1* | 11/2020 | Akman | G06T 17/10 |
| 10,937,150 | B2* | 3/2021 | Tan | G06V 20/10 |
| 11,069,145 | B1* | 7/2021 | Pearson | G06T 19/006 |
| 11,087,543 | B1* | 8/2021 | Cowburn | G06F 16/587 |
| 11,200,650 | B1* | 12/2021 | Ben Zadok | G06N 3/04 |
| 11,216,969 | B2* | 1/2022 | Nakabayashi | G06T 7/73 |
| 11,263,361 | B1* | 3/2022 | Soflin | G06F 30/13 |
| 11,393,114 | B1* | 7/2022 | Ebrahimi Afrouzi | |
| | | | | G01C 21/3848 |
| 11,481,925 | B1* | 10/2022 | Li | G06V 20/00 |
| 11,501,492 | B1* | 11/2022 | Li | H04N 23/698 |
| 11,514,674 | B2* | 11/2022 | Moulon | G01C 21/32 |
| 11,551,413 | B2* | 1/2023 | Sehgal | F24S 90/00 |
| 11,645,779 | B1* | 5/2023 | Pertsel | G06N 3/08 |
| | | | | 382/104 |
| 11,655,893 | B1* | 5/2023 | Pertsel | F16H 59/44 |
| | | | | 701/59 |
| 11,721,028 | B2* | 8/2023 | Veelaert | G06T 7/215 |
| | | | | 382/173 |
| 11,721,037 | B2* | 8/2023 | Li | G06T 7/73 |
| | | | | 382/154 |
| 11,721,066 | B2* | 8/2023 | Sanjurjo | G06Q 30/0633 |
| | | | | 705/26.5 |
| 2001/0017940 | A1* | 8/2001 | Kim | G06F 16/5838 |
| | | | | 382/162 |
| 2002/0090132 | A1* | 7/2002 | Boncyk | G06V 10/95 |
| | | | | 382/209 |
| 2005/0058341 | A1* | 3/2005 | Maruoka | G06T 5/009 |
| | | | | 382/167 |
| 2006/0181605 | A1* | 8/2006 | Boncyk | G06V 10/7515 |
| | | | | 348/14.01 |
| 2007/0031062 | A1* | 2/2007 | Pal | H04N 23/698 |
| | | | | 382/284 |
| 2007/0058855 | A1* | 3/2007 | Chou | G06T 7/33 |
| | | | | 382/154 |
| 2007/0103461 | A1* | 5/2007 | Suzuno | G06T 17/05 |
| | | | | 345/419 |
| 2007/0195344 | A1* | 8/2007 | Mochizuki | G06F 16/5838 |
| | | | | 358/1.9 |
| 2007/0216709 | A1* | 9/2007 | Kojima | G06V 10/56 |
| | | | | 345/619 |
| 2007/0216773 | A1* | 9/2007 | Kojima | G06V 40/178 |
| | | | | 707/E17.023 |
| 2008/0205756 | A1* | 8/2008 | Kamata | G06V 10/50 |
| | | | | 382/209 |
| 2008/0310757 | A1* | 12/2008 | Wolberg | G06V 20/653 |
| | | | | 382/285 |
| 2009/0015585 | A1* | 1/2009 | Klusza | G06F 16/51 |
| | | | | 345/420 |
| 2009/0109216 | A1* | 4/2009 | Uetabira | G06F 16/9577 |
| | | | | 345/419 |
| 2009/0141986 | A1* | 6/2009 | Boncyk | A63F 13/70 |
| | | | | 382/209 |
| 2009/0231441 | A1* | 9/2009 | Walker | H04N 5/77 |
| | | | | 348/207.1 |
| 2010/0114537 | A1* | 5/2010 | Pershing | G06T 11/60 |
| | | | | 703/1 |
| 2010/0201682 | A1* | 8/2010 | Quan | G06T 15/04 |
| | | | | 382/173 |
| 2011/0211760 | A1* | 9/2011 | Boncyk | G06T 7/11 |
| | | | | 382/218 |
| 2011/0235923 | A1* | 9/2011 | Weisenburger | G06T 7/73 |
| | | | | 382/201 |
| 2012/0026354 | A1* | 2/2012 | Hamada | G06V 10/751 |
| | | | | 348/222.1 |
| 2012/0162372 | A1 | 6/2012 | Ghyme | |
| 2012/0213427 | A1* | 8/2012 | Du | H04N 1/56 |
| | | | | 382/159 |
| 2013/0045751 | A1* | 2/2013 | Chao | G01C 21/3602 |
| | | | | 455/456.1 |
| 2013/0135315 | A1* | 5/2013 | Bares | G11B 27/031 |
| | | | | 345/473 |
| 2013/0148882 | A1* | 6/2013 | Lee | G06V 10/255 |
| | | | | 382/164 |
| 2013/0148883 | A1* | 6/2013 | Lee | G06F 16/785 |
| | | | | 382/165 |
| 2013/0148884 | A1* | 6/2013 | Lee | G06F 16/785 |
| | | | | 382/165 |
| 2013/0155058 | A1* | 6/2013 | Golparvar-Fard | |
| | | | | G06Q 10/06311 |
| | | | | 345/419 |
| 2013/0201365 | A1* | 8/2013 | Wirola | H04W 64/00 |
| | | | | 348/231.3 |
| 2013/0226515 | A1* | 8/2013 | Pershing | G06Q 50/16 |
| | | | | 702/156 |
| 2013/0272606 | A1* | 10/2013 | Nakamura | H04N 1/6055 |
| | | | | 382/167 |
| 2013/0286238 | A1* | 10/2013 | Tan | H04N 5/77 |
| | | | | 348/222.1 |
| 2014/0129136 | A1* | 5/2014 | Celia | G01S 19/49 |
| | | | | 701/472 |
| 2014/0253552 | A1* | 9/2014 | Agarwala | G06T 5/006 |
| | | | | 345/427 |
| 2014/0310630 | A1* | 10/2014 | Asikainen | G01C 21/206 |
| | | | | 715/771 |
| 2014/0363078 | A1* | 12/2014 | Balestri | G06F 16/583 |
| | | | | 382/165 |
| 2015/0019345 | A1* | 1/2015 | Masuko | G06Q 30/0269 |
| | | | | 705/14.66 |
| 2015/0025788 | A1 | 1/2015 | Crain et al. | |
| 2015/0036936 | A1* | 2/2015 | Balestri | G06F 18/214 |
| | | | | 382/201 |
| 2015/0169988 | A1* | 6/2015 | Zhang | G06V 10/751 |
| | | | | 382/209 |

(56) References Cited

U.S. PATENT DOCUMENTS

| | | | |
|---|---|---|---|
| 2015/0185992 A1* | 7/2015 | Ofstad | H04W 4/026 |
| | | | 715/771 |
| 2015/0227644 A1* | 8/2015 | Schultz | G01C 15/002 |
| | | | 703/1 |
| 2015/0243035 A1 | 8/2015 | Narasimha et al. | |
| 2015/0269785 A1* | 9/2015 | Bell | G06T 13/80 |
| | | | 345/427 |
| 2015/0278629 A1* | 10/2015 | Vanderhoff | G06T 7/0002 |
| | | | 382/162 |
| 2016/0005229 A1* | 1/2016 | Lee | G06T 11/60 |
| | | | 345/419 |
| 2016/0055268 A1* | 2/2016 | Bell | G06T 17/00 |
| | | | 703/1 |
| 2016/0180540 A1* | 6/2016 | Lookingbill | G06T 7/593 |
| | | | 382/154 |
| 2016/0217225 A1* | 7/2016 | Bell | G06F 30/13 |
| 2016/0253780 A1* | 9/2016 | Iwamoto | G06T 3/005 |
| | | | 382/154 |
| 2016/0265919 A1* | 9/2016 | Schuller | G01C 21/206 |
| 2016/0267331 A1* | 9/2016 | Pillai | G06T 15/06 |
| 2016/0300385 A1* | 10/2016 | Bell | G06T 17/00 |
| 2016/0335796 A1* | 11/2016 | Roimela | G06T 17/05 |
| 2016/0364907 A1* | 12/2016 | Schoenberg | G02B 27/017 |
| 2017/0019655 A1* | 1/2017 | Mueller | B60R 1/00 |
| 2017/0061236 A1* | 3/2017 | Pope | G06V 10/94 |
| 2017/0132835 A1* | 5/2017 | Halliday | G06T 15/00 |
| 2017/0206648 A1* | 7/2017 | Marra | G01C 21/20 |
| 2017/0249340 A1* | 8/2017 | Okuda | G06V 20/30 |
| 2017/0249576 A1* | 8/2017 | Bipes | G06Q 10/06315 |
| 2017/0249752 A1* | 8/2017 | Kotake | G06T 7/73 |
| 2017/0316115 A1* | 11/2017 | Lewis | G06T 7/12 |
| 2018/0005015 A1* | 1/2018 | Hou | G06V 10/751 |
| 2018/0005407 A1* | 1/2018 | Browning | G05D 1/024 |
| 2018/0018502 A1 | 1/2018 | Rao et al. | |
| 2018/0046733 A1* | 2/2018 | Wong | G06T 17/00 |
| 2018/0061126 A1* | 3/2018 | Huang | G01C 21/206 |
| 2018/0082410 A1* | 3/2018 | Schulte | G06F 18/22 |
| 2018/0150693 A1* | 5/2018 | Guo | H04W 4/025 |
| 2018/0225542 A1* | 8/2018 | Guo | G06F 18/22 |
| 2018/0225836 A1* | 8/2018 | Joshi | G06T 7/73 |
| 2018/0232471 A1* | 8/2018 | Schissler | G06F 18/2413 |
| 2018/0255431 A1* | 9/2018 | Robertson | G01C 21/005 |
| 2018/0300552 A1* | 10/2018 | Lorenzo | G06V 20/176 |
| 2018/0373933 A1 | 12/2018 | Ghinamo et al. | |
| 2019/0020817 A1* | 1/2019 | Shan | H04N 23/698 |
| 2019/0026958 A1* | 1/2019 | Gausebeck | H04N 13/10 |
| 2019/0066317 A1* | 2/2019 | Chang | G05D 1/0094 |
| 2019/0072395 A1* | 3/2019 | Namboodiri | G06F 30/18 |
| 2019/0080467 A1* | 3/2019 | Hirzer | G06T 7/11 |
| 2019/0156570 A1* | 5/2019 | Sanjurjo | G06T 19/20 |
| 2019/0162534 A1* | 5/2019 | Metzler | H04N 23/62 |
| 2019/0188538 A1* | 6/2019 | Kwant | G06F 18/2193 |
| 2019/0206044 A1* | 7/2019 | Marra | G06T 7/0004 |
| 2019/0236732 A1* | 8/2019 | Speasl | G01C 21/206 |
| 2019/0327413 A1* | 10/2019 | Lorenzo | G06T 17/05 |
| 2019/0370998 A1* | 12/2019 | Ciecko | G06T 7/248 |
| 2020/0003901 A1* | 1/2020 | Shroff | G06T 17/00 |
| 2020/0027273 A1* | 1/2020 | Jung | G08G 1/0969 |
| 2020/0034989 A1* | 1/2020 | Koyama | H04N 13/243 |
| 2020/0042006 A1* | 2/2020 | Jessen | H05B 47/105 |
| 2020/0074668 A1* | 3/2020 | Stenger | G06V 20/36 |
| 2020/0132472 A1* | 4/2020 | Mittal | G06F 16/29 |
| 2020/0134325 A1* | 4/2020 | Sun | G08G 1/0112 |
| 2020/0134688 A1* | 4/2020 | Tanii | A47F 5/00 |
| 2020/0134866 A1* | 4/2020 | Kitaura | G06T 7/74 |
| 2020/0272847 A1* | 8/2020 | Mittal | G06T 7/73 |
| 2020/0273071 A1* | 8/2020 | Croy | G06Q 30/0261 |
| 2020/0304375 A1* | 9/2020 | Chennai | G06T 17/05 |
| 2020/0349351 A1* | 11/2020 | Brook | G06V 20/20 |
| 2020/0388071 A1* | 12/2020 | Grabner | G06T 17/20 |
| 2020/0394836 A1* | 12/2020 | Halliday | G06V 20/176 |
| 2020/0394848 A1* | 12/2020 | Choudhary | G06T 7/11 |
| 2021/0004933 A1* | 1/2021 | Wong | G06T 7/30 |
| 2021/0023992 A1* | 1/2021 | Broggi | B60R 1/00 |
| 2021/0027532 A1* | 1/2021 | Lin | G06T 17/05 |
| 2021/0055109 A1* | 2/2021 | Teng | G01C 21/3602 |
| 2021/0064216 A1* | 3/2021 | Li | G06F 3/04815 |
| 2021/0090289 A1* | 3/2021 | Karanam | G06T 7/74 |
| 2021/0095992 A1* | 4/2021 | Kitaura | G06T 7/74 |
| 2021/0104093 A1* | 4/2021 | Vincent | G06F 30/13 |
| 2021/0123746 A1* | 4/2021 | Chang | G01C 21/1654 |
| 2021/0125397 A1* | 4/2021 | Moulon | G06T 17/00 |
| 2021/0142558 A1* | 5/2021 | Ely | G06T 17/05 |
| 2021/0150755 A1* | 5/2021 | Gao | G06T 7/73 |
| 2021/0150805 A1* | 5/2021 | Stekovic | G06T 7/11 |
| 2021/0158570 A1* | 5/2021 | Mohandoss | H04N 1/6052 |
| 2021/0183080 A1* | 6/2021 | Hoiem | G06T 7/33 |
| 2021/0183161 A1* | 6/2021 | Upendran | G06T 7/74 |
| 2021/0211839 A1* | 7/2021 | Lee | H04W 4/33 |
| 2021/0217230 A1* | 7/2021 | Halliday | G06V 20/653 |
| 2021/0224538 A1* | 7/2021 | Driancourt | G01S 19/47 |
| 2021/0232819 A1* | 7/2021 | VanBlon | G06F 3/017 |
| 2021/0241022 A1* | 8/2021 | Lee | G06V 10/82 |
| 2021/0256289 A1* | 8/2021 | Kumagai | G06V 10/40 |
| 2021/0279950 A1* | 9/2021 | Phalak | G06V 20/20 |
| 2021/0279957 A1* | 9/2021 | Eder | G06N 3/08 |
| 2021/0281748 A1* | 9/2021 | Nogami | H04N 23/631 |
| 2021/0311504 A1* | 10/2021 | Chai | G05D 1/101 |
| 2021/0326601 A1* | 10/2021 | Tang | G06F 18/22 |
| 2021/0360368 A1* | 11/2021 | Li | H04W 4/029 |
| 2021/0377442 A1* | 12/2021 | Boyadzhiev | H04N 5/77 |
| 2021/0383115 A1* | 12/2021 | Alon | G06Q 30/0276 |
| 2021/0385378 A1* | 12/2021 | Cier | H04N 5/2624 |
| 2022/0003555 A1* | 1/2022 | Colburn | G05D 1/0274 |
| 2022/0005232 A1* | 1/2022 | Harviainen | G06T 9/00 |
| 2022/0013012 A1* | 1/2022 | Higuchi | G08G 1/143 |
| 2022/0019810 A1* | 1/2022 | Farber | H04N 7/18 |
| 2022/0027656 A1* | 1/2022 | Jia | G06T 7/11 |
| 2022/0076019 A1* | 3/2022 | Moulon | G05D 1/0219 |
| 2022/0082403 A1* | 3/2022 | Shapira | G01C 21/3848 |
| 2022/0092227 A1* | 3/2022 | Yin | G06T 17/00 |
| 2022/0114291 A1* | 4/2022 | Li | H04W 4/024 |
| 2022/0114785 A1* | 4/2022 | Teranishi | G06T 19/00 |
| 2022/0130064 A1* | 4/2022 | Tomar | G06T 19/006 |
| 2022/0147662 A1* | 5/2022 | Halliday | G06T 15/04 |
| 2022/0164493 A1* | 5/2022 | Li | G06V 10/7715 |
| 2022/0207202 A1* | 6/2022 | Beyhaghi | G06F 30/13 |
| 2022/0215576 A1* | 7/2022 | Sano | G01C 21/32 |
| 2022/0215622 A1* | 7/2022 | Stevens | G06T 17/05 |
| 2022/0224833 A1* | 7/2022 | Cier | H04N 5/445 |
| 2022/0269885 A1* | 8/2022 | Wixson | G06V 10/82 |
| 2022/0269888 A1* | 8/2022 | Stoeva | G06V 10/255 |
| 2022/0277516 A1* | 9/2022 | Matsunobu | G06T 19/00 |
| 2022/0284146 A1* | 9/2022 | Tran | G06N 3/047 |
| 2022/0318443 A1* | 10/2022 | Yang | G06N 3/045 |
| 2022/0319046 A1* | 10/2022 | Bao | G06T 7/10 |
| 2022/0319128 A1* | 10/2022 | Lee | G06F 3/0346 |
| 2022/0327719 A1* | 10/2022 | Shaag | G01S 17/931 |
| 2022/0337894 A1* | 10/2022 | Price | H04N 21/234381 |
| 2022/0351466 A1* | 11/2022 | Huang | G06V 10/751 |
| 2022/0351650 A1* | 11/2022 | Price | G06V 10/25 |
| 2022/0358694 A1* | 11/2022 | Zhang | G06T 7/60 |
| 2022/0373655 A1* | 11/2022 | Li | G02B 26/101 |
| 2022/0391627 A1* | 12/2022 | Powles | G06Q 10/103 |
| 2022/0394213 A1* | 12/2022 | De Steuben | H04N 7/188 |
| 2022/0405878 A1* | 12/2022 | Kikuchi | G06T 17/05 |
| 2023/0037866 A1* | 2/2023 | Yoo | H04N 13/221 |
| 2023/0071446 A1* | 3/2023 | Narayana | G06T 5/50 |
| 2023/0095173 A1* | 3/2023 | Khosravan | G06T 5/50 |
| | | | 382/254 |
| 2023/0119214 A1* | 4/2023 | Zweigle | G06T 19/00 |
| | | | 345/419 |
| 2023/0125295 A1* | 4/2023 | Min | G05D 1/0212 |
| | | | 701/25 |
| 2023/0138762 A1* | 5/2023 | Lambert | G06T 7/38 |
| | | | 382/103 |
| 2023/0147960 A1* | 5/2023 | Hosaka | G06T 7/00 |
| | | | 382/155 |
| 2023/0154032 A1* | 5/2023 | Sinha | G06V 10/764 |
| | | | 382/103 |
| 2023/0177714 A1* | 6/2023 | Strader | G06T 7/11 |
| | | | 702/2 |

(56) References Cited

U.S. PATENT DOCUMENTS

| | | | | |
|---|---|---|---|---|
| 2023/0206393 A1* | 6/2023 | Hutchcroft | ............... | G06N 3/08 |
| | | | | 382/284 |
| 2023/0206763 A1* | 6/2023 | Beaurepaire | ......... | G08G 1/0133 |
| | | | | 340/932.2 |
| 2023/0211726 A1* | 7/2023 | Nehushtan | ........... | G08G 1/0141 |
| | | | | 701/117 |
| 2023/0215087 A1* | 7/2023 | Castillo | ..................... | G06T 7/10 |
| | | | | 345/419 |
| 2023/0222817 A1* | 7/2023 | Sun | ........................ | G06N 3/08 |
| | | | | 382/103 |
| 2023/0230318 A1* | 7/2023 | Nam | ........................ | G06T 7/74 |
| | | | | 345/419 |
| 2023/0236037 A1* | 7/2023 | Heilbron | ............ | G01C 21/3815 |
| | | | | 701/422 |
| 2023/0236608 A1* | 7/2023 | Cheah | ....................... | G06T 7/60 |
| | | | | 701/25 |
| 2023/0239574 A1* | 7/2023 | Dzitsiuk | ................ | H04N 23/80 |
| | | | | 348/207.99 |
| 2023/0243649 A1* | 8/2023 | Pershing | ................ | G06Q 50/08 |
| | | | | 382/199 |
| 2023/0245289 A1* | 8/2023 | Ng | .......................... | G06T 5/006 |
| | | | | 345/629 |
| 2023/0245341 A1* | 8/2023 | Kai | ........................ | G06T 17/05 |
| | | | | 382/103 |
| 2023/0245390 A1* | 8/2023 | Zhu | ....................... | G06T 11/203 |
| | | | | 345/423 |

FOREIGN PATENT DOCUMENTS

| | | |
|---|---|---|
| CN | 105973236 A | 9/2016 |
| CN | 106447585 A | 2/2017 |

OTHER PUBLICATIONS

International Search Report in PCT/CN2018/084736 dated Jan. 30, 2019, 4 pages.
Written Opinion in PCT/CN2018/084736 dated Jan. 30, 2019, 4 pages.

* cited by examiner

SYSTEMS AND METHODS FOR UPDATING A 3D MODEL OF BUILDING

CROSS-REFERENCE TO RELATED APPLICATIONS

This application is a Continuation of International Application No. PCT/CN2018/084736, filed on Apr. 27, 2018, the contents of which are hereby incorporated by reference in its entirety.

TECHNICAL FIELD

The present disclosure generally relates to indoor positioning and navigation services, and in particular, to systems and methods for updating a 3D model of a building that is used for providing indoor positioning and navigation services.

BACKGROUND

Navigation applications (app) installed in user devices are used frequently in daily lives. The navigation applications usually require an input of a destination and generate routes to navigate a user from his/her current location to the destination. The conventional navigation applications rely on a positioning technology such as a Global positioning system (GPS) to continuously position and update the location of the user device. The conventional navigation applications require the user device to be in an environment with strong wireless signals and hence cannot be used in any location with poor wireless signals. Also, the conventional navigation applications cannot obtain the inner structure of a building and hence cannot be used for indoor navigation.

SUMMARY

According to one aspect of the present disclosure, a system is provided. The system may include at least one storage medium including a set of instructions for updating a model of a building and at least one processor in communication with the at least one storage medium. When executing the set of instructions, the at least one processor may be directed to obtain a three-dimensional (3D) model of a building including reference environmental data associated with a plurality of reference locations of the building. The at least one processor may be further directed to obtain, from a user device, current environmental data corresponding to a current location of the building and identify, from the 3D model, a target reference location corresponding to the current location from the plurality of reference locations of the building. The target reference location may correspond to target reference environmental data and the current environmental data may correspond to target reference environmental data of the reference environmental data of the 3D model associated with the target reference location. The at least one processor may be further directed to compare the current environmental data with the target reference environmental data. The at least one processor may be further directed to send to the user device the target reference location when the current environmental data match the target reference environmental data and update the 3D model with the current environmental data when the current environmental data statistically un-match the target reference environmental data.

In some embodiments, the at least one processor may be further directed to receive environmental data of the current location from a plurality of other user devices within a predetermined period of time immediately prior to a current time. The at least one processor may be further directed to compare the environmental data from different user devices of the plurality of other user devices with the current environmental data and compare the environmental data from different user devices of the plurality of other user devices with the corresponding reference environmental data. The at least one processor may be further directed to determine that the current environmental data of the current location statistically un-match the target reference environmental data when the environmental data from different user devices all match with the current environmental data for more than a third threshold but the environmental data from different user devices and the current environmental data don't match with the target reference environmental data for more than a fourth threshold.

In some embodiments, the 3D model of the building may be a point cloud model or a mesh model. The target reference environmental data may include a plurality of target reference feature points corresponding to environmental details of the target reference location and the current environmental data may include a plurality of current feature points corresponding to environmental details of the current location.

In some embodiments, to compare the current environmental data with the target reference environmental data, the at least one processor may be directed to compare the plurality of current feature points with the target reference feature points. The at least one processor may be directed to determine the current environmental data match the target reference environmental data when the comparison returns a matching degree greater than a first threshold and determine the current environmental data un-match the target reference environmental data when the comparison returns the matching degree less than or equal to the first threshold.

In some embodiments, to compare the plurality of current feature points with the plurality of target reference feature points, the at least one processor may be further directed to match each of the plurality of current feature points with one of the plurality of target reference feature points, and determine a difference between a color or a greyscale value of each of the plurality of current feature points and a color or greyscale value of a matched point in the plurality of target reference feature points. The at least one processor may be further directed to generate the matching degree between the current environmental data of the building and the target reference environmental data of the 3D model of the building based on the difference.

In some embodiments, after determining that the current environmental data statistically un-match the target reference environmental data, the at least one processor may be further directed to determine a plurality of un-matched feature points, wherein the color or the greyscale value of each of the plurality of un-matched points is different from the color or the greyscale value of the corresponding target reference feature point. The at least one processor may be further directed to select some or all un-matched feature points from the plurality of un-matched feature points, and determine an un-matched region in the current environmental data based on the selected some or all un-matched feature points.

In some embodiments, to update the 3D model of the building with the current environmental data, the at least one processor may be further directed to determine a first region in the target reference environmental data of the 3D model of the building that corresponds to the un-matched region in the current environmental data and update the first region in the target reference environmental data of the 3D model of the building based on the un-matched region in the current environmental data to generate the updated 3D model of the building.

In some embodiments, the first region in the 3D model of the building may be determined using a perspective-n-point (PNP) method.

In some embodiments, to update the first region in the target reference environmental data of the 3D model of the building based on the un-matched region in the current environmental data, the at least one processor may be directed to determine a matched region in the current environmental data and a second region in the target reference environmental data of the 3D model of the building that corresponds to the matched region. The at least one processor may be further directed to register the matched region in the current environmental data with the second region in the 3D model of the building and register the un-matched region in the current environmental data with the first region in the 3D model of the building, based on the registration of the matched region with the second region, to update the first region of the 3D model of the building.

In some embodiments, the building may be enclosed or semi-enclosed, and the image of the building may be taken by the user device inside the building.

According to another aspect of the present disclosure, a method is provided. The method may be implemented on a computing device having at least one storage device storing a set of instructions for updating a model of a building, and at least one processor in communication with the at least one storage device. The method may include obtaining a three-dimensional (3D) model of a building including reference environmental data associated with a plurality of reference locations of the building. The method may further include obtaining, from a user device, current environmental data corresponding to a current location of the building and identifying, from the 3D model, a target reference location corresponding to the current location from the plurality of reference locations of the building. The target reference location may correspond to target reference environmental data and the current environmental data may correspond to target reference environmental data of the reference environmental data of the 3D model associated with the target reference location. The method may further include comparing the current environmental data with the target reference environmental data. The method may further include sending to the user device the target reference location when the current environmental data match the target reference environmental data and updating the 3D model with the current environmental data when the current environmental data statistically un-match the target reference environmental data.

According to another aspect of the present disclosure, a system is provided. The system may include at least one storage medium including a set of instructions for updating a model of a building and at least one processor in communication with the at least one storage medium. Wherein when executing the set of instructions, the at least one processor may be directed to obtain a three-dimensional (3D) model of a building including reference environmental data associated with a plurality of reference locations of the building. The at least one processor may be further directed to receive and accept a connection request from a user device and detect a customer application executing on the user device, the customer application collecting environmental information of the user device from one or more sensors of the user device and automatically communicating with the system over a network. The at least one processor may be further directed to communicate with the customer application executing on the user device to receive a positioning request and obtain, from the customer application of the user device, current environmental data corresponding to a current location of the building based on the environmental information detected by the one or more sensors of the user device. The at least one processor may be further directed to identify, from the 3D model, a target reference location corresponding to the current location from the plurality of reference locations of the building. The target reference location may correspond to target reference environmental data and the current environmental data may correspond to target reference environmental data of the reference environmental data of the 3D model associated with the target reference location. The at least one processor may be further directed to compare the current environmental data with the target reference environmental data and send to the user device communication signals when the current environmental data match the target reference environmental data. The communication signals may be structured to include a command and the target reference location. The command may be configured to render the user terminal to generate a presentation of the target reference location on a display of the user device. The at least one processor may be further directed to update the 3D model with the current environmental data when the current environmental data statistically un-match the target reference environmental data.

According to another aspect of the present disclosure, a method is provided. The method may be implemented on a computing device having at least one storage device storing a set of instructions for updating a model of a building, and at least one processor in communication with the at least one storage device. The method may include obtaining a three-dimensional (3D) model of a building including reference environmental data associated with a plurality of reference locations of the building. The method may further include receiving and accepting a connection request from a user device and detecting a customer application executing on the user device, the customer application collecting environmental information of the user device from one or more sensors of the user device and automatically communicating with the system over a network. The method may further include communicating with the customer application executing on the user device to receive a positioning request and obtaining, from the customer application of the user device, current environmental data corresponding to a current location of the building based on the environmental information detected by the one or more sensors of the user device. The method may further include identifying, from the 3D model, a target reference location corresponding to the current location from the plurality of reference locations of the building. The target reference location may correspond to target reference environmental data and the current environmental data may correspond to target reference environmental data of the reference environmental data of the 3D model associated with the target reference location. The method may further include comparing the current environmental data with the target reference environmental data and sending to the user device communication signals when the current environmental data match the target reference environmental data. The communication signals may be structured to include a command and the target reference location, and the command may be configured to render the user terminal to generate a presentation of the target reference location on a display of the user device. The method may further include updating the 3D model with the current environmental data when the current environmental data statistically un-match the target reference environmental data.

According to another aspect of the present disclosure, a non-transitory computer readable medium is provided. The non-transitory computer readable medium may include at least one set of instructions for updating a model of a building. When executed by at least one processor of an electronic terminal, the at least one set of instructions may direct the at least one processor to perform acts of obtaining a three-dimensional (3D) model of a building including reference environmental data associated with a plurality of reference locations of the building. The at least one set of instructions may further direct the at least one processor to perform acts of obtaining, from a user device, current environmental data corresponding to a current location of the building and identifying, from the 3D model, a target reference location corresponding to the current location from the plurality of reference locations of the building. The target reference location may correspond to target reference environmental data and the current environmental data may correspond to target reference environmental data of the reference environmental data of the 3D model associated with the target reference location. The at least one set of instructions may further direct the at least one processor to perform acts of comparing the current environmental data with the target reference environmental data. The at least one set of instructions may further direct the at least one processor to perform acts of sending to the user device communication signals including the target reference location when the current environmental data match the target reference environmental data and updating the 3D model with the current environmental data when the current environmental data statistically un-match the target reference environmental data.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein.

DETAILED DESCRIPTION

Figure 1:
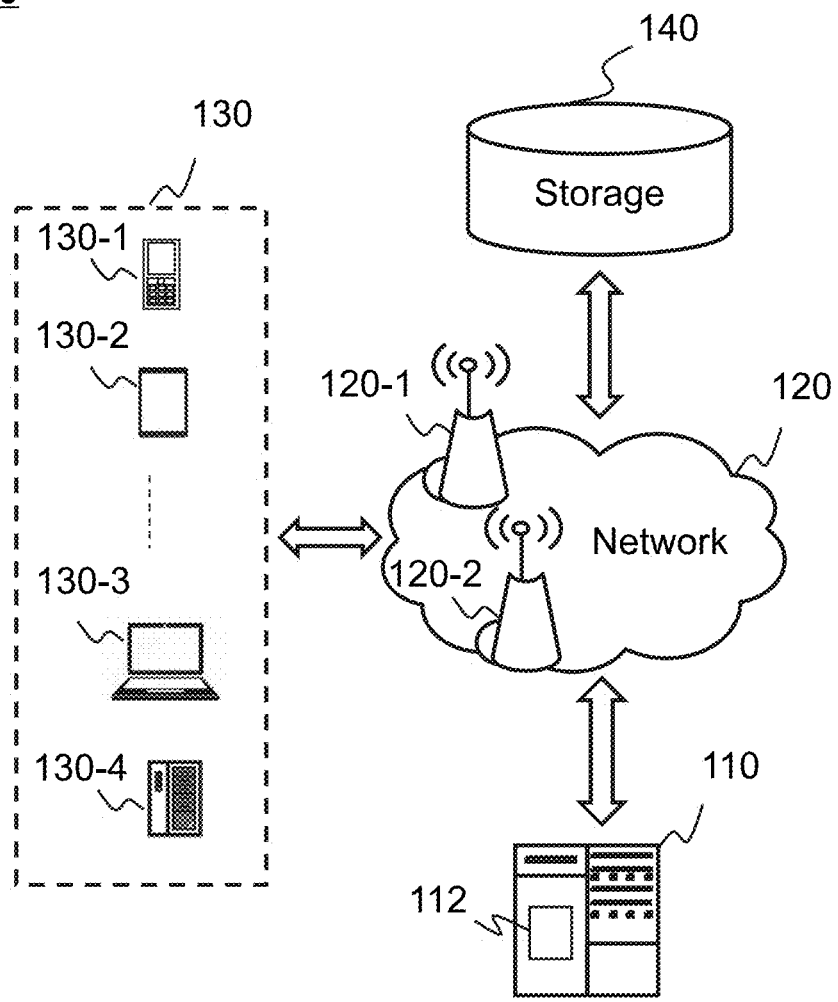
FIG. 1 is a schematic diagram of an exemplary indoor positioning and navigation system according to some embodiments of the present disclosure.

The following description is presented to enable any person skilled in the art to make and use the present disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but is to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprises," "comprising," "includes," and/or "including" when used in this disclosure, specify the presence of stated features, integers, steps, operations, elements, and/or components, but do not preclude the presence or addition of one or more other features, integers, steps, operations, elements, components, and/or groups thereof.

These and other features, and characteristics of the present disclosure, as well as the methods of operations and functions of the related elements of structure and the combination of parts and economies of manufacture, may become more apparent upon consideration of the following description with reference to the accompanying drawing(s), all of which form part of this specification. It is to be expressly understood, however, that the drawing(s) are for the purpose of illustration and description only and are not intended to limit the scope of the present disclosure. It is understood that the drawings are not to scale.

The flowcharts used in the present disclosure illustrate operations that systems implement according to some embodiments of the present disclosure. It is to be expressly understood, the operations of the flowcharts may be implemented not in order. Conversely, the operations may be implemented in inverted order, or simultaneously. Moreover, one or more other operations may be added to the flowcharts. One or more operations may be removed from the flowcharts.

Unless otherwise stated, the term "current location" in the present disclosure refers to a part of the building that a user device is currently detecting or a location of the building shown on a photo or a video taken by the user device in real time. The term "location of the user device" in the present disclosure refers to a location point that the user is standing at.

It should be noted that, the terms "first threshold", "second threshold", "third threshold", "fourth threshold", and "fifth threshold" are preset conditions associated with corresponding determinations. For better understanding, exemplary values of these thresholds are given in the present disclosure, but these exemplary values shall not be limiting.

An aspect of the present disclosure relates to systems and methods for updating a 3D model of a building that is used for providing an indoor positioning and navigation service. For example, a server may build a 3D model of a building that doesn't contain any poster. A plurality of user devices may download the 3D model of the building from the server and provide indoor navigation services to a plurality of users based on the 3D model of the building. Several days later, a poster may be pasted on a wall. When the user devices are providing the indoor navigation services, the user devices may continuously capture photos of the locations in front of the users. The server may identify, from all the walls in the 3D model, a target wall (without the poster) (e.g., based on the environmental details such as size, shapes, texture, color, other objects on the wall) as a target reference location corresponding to the wall (with the poster) in the photos. The server may determine that the target wall in the 3D model statically un-match the wall in the photos because all the photos captured by the user devices are the same (e.g., containing the poster) and are different from the wall in the 3D model which does not contain the poster. Then the server may update the 3D model based on the photos (e.g., by adding the poster on the wall in the 3D model).

FIG. 1 is a schematic diagram of an exemplary indoor positioning and navigation system 100 according to some embodiments of the present disclosure. For example, the indoor positioning and navigation system 100 may provide an indoor positioning and navigation service to a user. The indoor positioning and navigation system 100 may be used in a building that is enclosed or semi-enclosed. The building may include but not limited to a shopping mall, a supermarket, an airport terminal, an indoor parking garage, or the like, or any combination thereof. The indoor positioning and navigation system 100 may include a server 110, a network and/or cloud 120, a user device 130, and a storage 150. The server 110 may include a processing engine 112.

The server 110 may be configured to process information and/or data relating to a model of a building. For example, the server 110 may update a 3D model of the building based on an image of the building sent from a user device 130. In some embodiments, the server 110 may be a single server, or a server group. The server group may be centralized, or distributed (e.g., server 110 may be a distributed system). In some embodiments, the server 110 may be local or remote. For example, the server 110 may access information and/or data stored in the user device 130, and/or the storage 140 via the network and/or cloud 120. As another example, the server 110 may be directly connected to the user device 130, and/or the storage 140 to access stored information and/or data. In some embodiments, the server 110 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof. In some embodiments, the server 110 may be implemented on a computing device 200 having one or more components illustrated in FIG. 2 in the present disclosure.

In some embodiments, the server 110 may include a processing engine 112. The processing engine 112 may process information and/or data relating to the indoor positioning and navigation service described in the present disclosure. For example, the processing engine 112 may obtain current environmental data corresponding to a current location of the building from a user device 130. In some embodiments, the processing engine 112 may include one or more processing engines (e.g., single-core processing engine(s) or multi-core processor(s)). Merely by way of example, the processing engine 112 may include one or more hardware processors, such as a central processing unit (CPU), an application-specific integrated circuit (ASIC), an application-specific instruction-set processor (ASIP), a graphics processing unit (GPU), a physics processing unit (PPU), a digital signal processor (DSP), a field programmable gate array (FPGA), a programmable logic device (PLD), a controller, a microcontroller unit, a reduced instruction-set computer (RISC), a microprocessor, or the like, or any combination thereof.

The network and/or cloud 120 may facilitate exchange of information and/or data. In some embodiments, one or more components of the indoor positioning and navigation system 100 (e.g., the server 110, the user device 130, and the storage 140) may transmit information and/or data to other component(s) in the indoor positioning and navigation system 100 via the network and/or cloud 120. For example, the server 110 may receive current environmental data (e.g., a photo) from the user device 130 via the network and/or cloud 120. In some embodiments, the network and/or cloud 120 may be any type of wired or wireless network, or combination thereof. Merely by way of example, the network and/or cloud 120 may include a cable network, a wireline network, an optical fiber network, a tele communications network, an intranet, an Internet, a local area network (LAN), a wide area network (WAN), a wireless local area network (WLAN), a metropolitan area network (MAN), a public telephone switched network (PSTN), a Bluetooth network, a ZigBee network, a near field communication (NFC) network, a global system for mobile communications (GSM) network, a code-division multiple access (CDMA) network, a time-division multiple access (TDMA) network, a general packet radio service (GPRS) network, an enhanced data rate for GSM evolution (EDGE) network, a wideband code division multiple access (WCDMA) network, a high speed downlink packet access (HSDPA) network, a long term evolution (LTE) network, a user datagram protocol (UDP) network, a transmission control protocol/Internet protocol (TCP/IP) network, a short message service (SMS) network, a wireless application protocol (WAP) network, a ultra wide band (UWB) network, an infrared ray, or the like, or any combination thereof. In some embodiments, the network and/or cloud 120 may include one or more network access points. For example, the network and/or cloud 120 may include wired or wireless network access points such as base stations and/or internet exchange points 120-1, 120-2, . . . , through which one or more components of the indoor positioning and navigation system 100 may be connected to the network and/or cloud 120 to exchange data and/or information between them.

In some embodiments, the server 110 may be remote from the user device 130, and the network and/or cloud 120 may be a wireless network such as an Internet. For example, the user device 130 may send information related to an indoor positioning and navigation service (e.g., a photo of a particular location of a building, a destination) to the server 110 via the network and/or cloud 120. The network and/or cloud 120 may provide the indoor positioning and navigation service to the user device 130.

In some embodiments, the server 110 may be remote from the user device 130, and the network and/or cloud 120 may be a cloud platform. For example, the user device 130 may send information related to an indoor positioning and navigation service to the cloud platform. The server 110 may access the cloud platform and acquire the information sent by the user device 130. In some embodiments, the cloud platform may store information sent by a plurality of user device 130. The server 110 may collect information corresponding to a particular building and update the 3D model of the building based on the information sent by the plurality of user devices 130. The server 110 may provide an indoor positioning and navigation service to the user device 130 based on the updated 3D model of the building.

In some embodiments, the server 110 may be a local processor, and the network and/or cloud 120 may be a local wireless network, such as a WLAN, a Bluetooth network, an NFC, a ZigBee network. The server 110 may be installed in a particular building and may store a 3D model of the building. The server 110 may provide an indoor positioning and navigation service to a user device 130 in the building based on the 3D model of the building. The server 110 may also acquire information of the building from a plurality of user device 130 and update the 3D model of the building.

In some embodiments, a user of the user device 130 (also referred to as a requester) may use the user device 130 to transmit a service request for an indoor positioning and navigation service to the server 110, or receive service and/or information or instructions from the server 110. In some embodiments, the user device 130 may include a mobile device 130-1, a tablet computer 130-2, a laptop computer 130-3, a built-in device in a motor vehicle 130-4, or the like, or any combination thereof. In some embodiments, the mobile device 130-1 may include a smart home device, a wearable device, a smart mobile device, a virtual reality device, an augmented reality device, a camera, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a smart bracelet, a smart footgear, a smart glass, a smart helmet, a smart watch, a smart clothing, a smart backpack, a smart accessory, a smart camera, or the like, or any combination thereof. In some embodiments, the smart mobile device may include a smartphone, a personal digital assistance (PDA), a gaming device, a navigation device, a point of sale (POS) device, or the like, or any combination thereof. In some embodiments, the virtual reality device and/or the augmented reality device may include a virtual reality helmet, a virtual reality glass, a virtual reality patch, an augmented reality helmet, an augmented reality glass, an augmented reality patch, or the like, or any combination thereof. For example, the virtual reality device and/or the augmented reality device may include a Google Glass™ a RiftCon™, a Fragments™, a Gear VR™, etc. In some embodiments, built-in device in the motor vehicle 130-4 may include an onboard computer, an onboard television, etc. In some embodiments, the user device 130 may be a device with positioning technology for locating the location of the requestor and/or the user device 130. In some embodiments, the user device 130 may transmit positioning information to the server 110. In some embodiments, the user device 130 may send an indoor positioning and navigation service request and information related to the indoor positioning and navigation service request (e.g., a photo of the current location of a building, a destination) to the server 110. The server 110 may process the information and provide the indoor positioning and navigation service to the user device 130. For example, the server 110 may generate an estimated location of the user device, or a route from the estimated location of the user device to the destination to the user device 130. The user device 130 may display the estimated location of the user device and the route from the estimated location of the user device to the destination on an electronic map or a mobile application (app) installed in the user device 130 on a display interface (e.g., a screen).

The storage 140 may store data and/or instructions. In some embodiments, the storage 140 may store data obtained from the user device 130. In some embodiments, the storage 140 may store data and/or instructions that the server 110 may execute or use to perform exemplary methods described in the present disclosure. In some embodiments, the storage 140 may include a mass storage, a removable storage, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memory may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage 140 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage 140 may be connected to the network and/or cloud 120 to communicate with one or more components of the indoor positioning and navigation system 100 (e.g., the server 110, the user device 130). One or more components in the indoor positioning and navigation system 100 may access the data or instructions stored in the storage 140 via the network and/or cloud 120. In some embodiments, the storage 140 may be directly connected to or communicate with one or more components in the indoor positioning and navigation system 100 (e.g., the server 110, the user device 130). In some embodiments, the storage 140 may be a part of the server 110.

In some embodiments, one or more components of the indoor positioning and navigation system 100 (e.g., the server 110, the user device 130) may access the storage 140.

In some embodiments, one or more components of the indoor positioning and navigation system 100 may read and/or modify information relating to the requester, and/or the model of the building when one or more conditions are met. For example, the server 110 may read and/or modify one or more users' information after a service.

It should be noted that the application scenario illustrated in FIG. 1 is only provided for illustration purposes, and not intended to limit the scope of the present disclosure. For example, the indoor positioning and navigation system 100 may be used as a positioning system.

Figure 2:
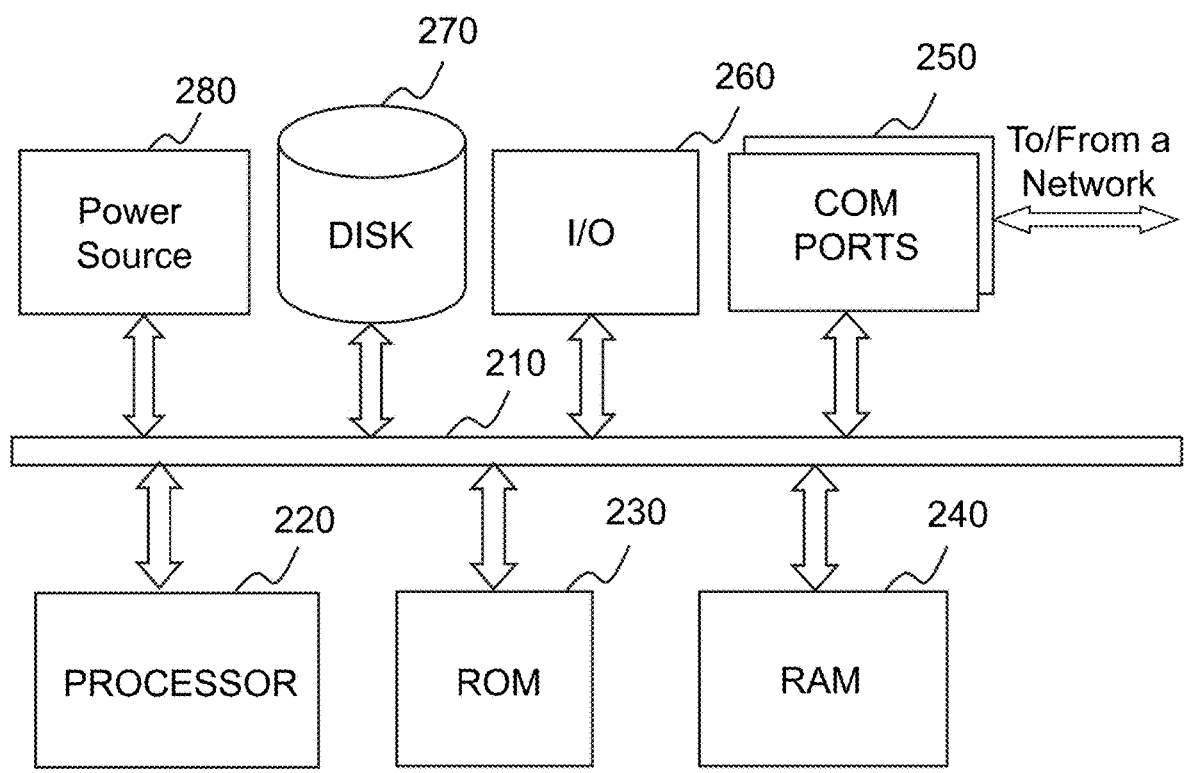
FIG. 2 is a schematic diagram illustrating exemplary hardware and software components of a computing device on which the server, and/or the user device may be implemented according to some embodiments of the present disclosure.

FIG. 2 is a schematic diagram illustrating exemplary hardware and software components of a computing device 200 on which the server 110, and/or the user device 130 may be implemented according to some embodiments of the present disclosure. For example, the processing engine 112 may be implemented on the computing device 200 and configured to perform functions of the processing engine 112 disclosed in this disclosure.

The computing device 200 may be used to implement an indoor positioning and navigation system for the present disclosure. The computing device 200 may be implement by any component of the indoor positioning and navigation service as described herein. In FIG. 2, only one such computer device is shown purely for convenience purposes. One of ordinary skill in the art would understood at the time of filing of this application that the computer functions relating to the indoor positioning and navigation service as described herein may be implemented in a distributed fashion on a number of similar platforms, to distribute the processing load.

The computing device 200, for example, may include COM ports 250 connected to and from a network connected thereto to facilitate data communications. The computing device 200 may also include a processor (e.g., the processor 220), in the form of one or more processors (e.g., logic circuits), for executing program instructions. For example, the processor may include interface circuits and processing circuits therein. The interface circuits may be configured to receive electronic signals from a bus 210, wherein the electronic signals encode structured data and/or instructions for the processing circuits to process. The processing circuits may conduct logic calculations, and then determine a conclusion, a result, and/or an instruction encoded as electronic signals. Then the interface circuits may send out the electronic signals from the processing circuits via the bus 210.

The exemplary computing device may include the internal communication bus 210, program storage and data storage of different forms including, for example, a disk 270, and a read only memory (ROM) 230, or a random access memory (RAM) 240, for various data files to be processed and/or transmitted by the computing device. The exemplary computing device may also include program instructions stored in the ROM 230, RAM 240, and/or other type of non-transitory storage medium to be executed by the processor 220. The methods and/or processes of the present disclosure may be implemented as the program instructions. The computing device 200 also includes an I/O component 260, supporting input/output between the computer and other components. The computing device 200 may also receive programming and data via network communications.

Merely for illustration, only one CPU and/or processor is illustrated in FIG. 2. Multiple CPUs and/or processors are also contemplated; thus operations and/or method steps performed by one CPU and/or processor as described in the present disclosure may also be jointly or separately performed by the multiple CPUs and/or processors. For example, if in the present disclosure the CPU and/or processor of the computing device 200 executes both step A and step B, it should be understood that step A and step B may also be performed by two different CPUs and/or processors jointly or separately in the computing device 200 (e.g., the first processor executes step A and the second processor executes step B, or the first and second processors jointly execute steps A and B).

Figure 3:
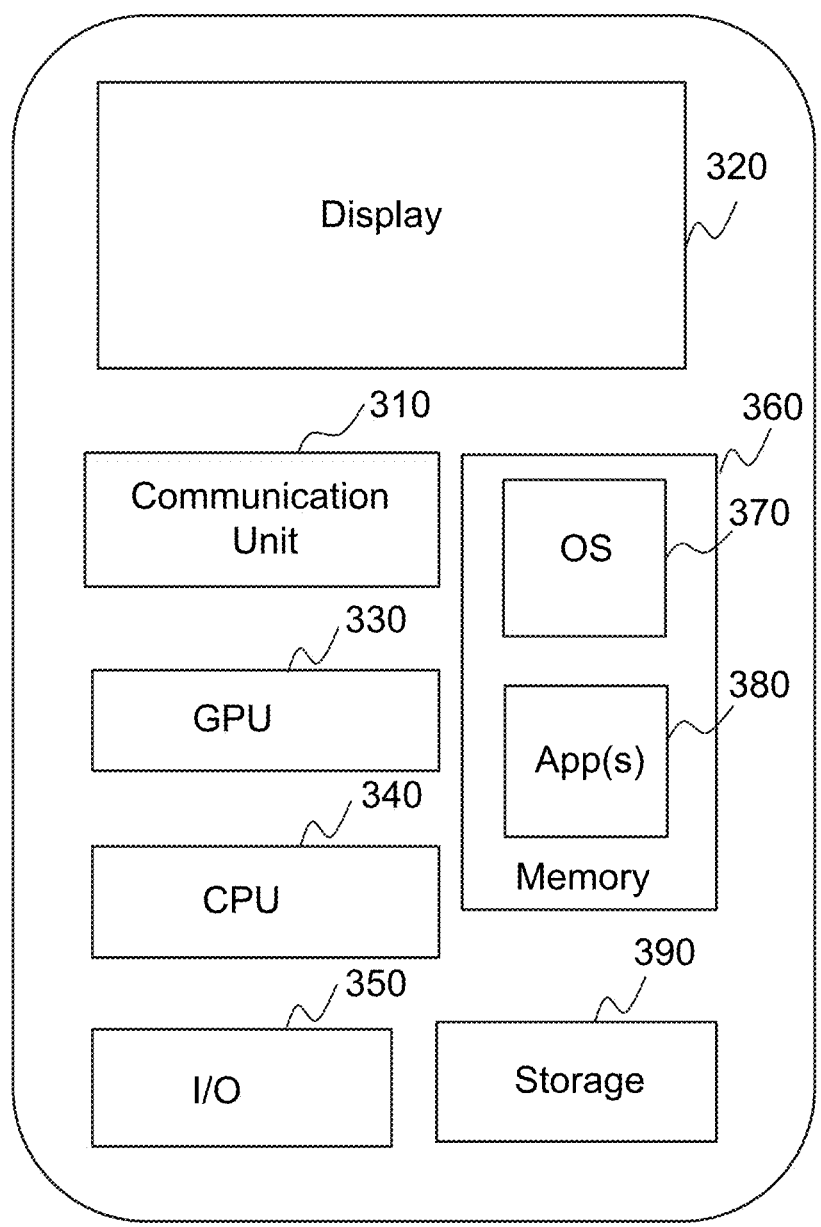
FIG. 3 is a schematic diagram illustrating exemplary hardware and/or software components of an exemplary mobile device on which the user device or the provider terminal may be implemented according to some embodiments of the present disclosure.

FIG. 3 is a schematic diagram illustrating exemplary hardware and/or software components of an exemplary mobile device 300 on which the user device 130 or the provider terminal 140 may be implemented according to some embodiments of the present disclosure. As illustrated in FIG. 3, the mobile device 300 may include a communication platform 310, a display 320, a graphic processing unit (GPU) 330, a central processing unit (CPU) 340, an I/O 350, a memory 360, and a storage 390. The CPU may include interface circuits and processing circuits similar to the processor 220. In some embodiments, any other suitable component, including but not limited to a system bus or a controller (not shown), may also be included in the mobile device 300. In some embodiments, a mobile operating system 370 (e.g., iOS™, Android™, Windows Phone™, etc.) and one or more applications 380 may be loaded into the memory 360 from the storage 390 in order to be executed by the CPU 340. The applications 380 may include an indoor positioning and navigation application (APP) installed on the mobile device 300 for receiving information associated with the user (e.g., current location, destination, route preferences) and providing an indoor positioning and navigation service based on the information. In some embodiments, the APP may be used as electronic map. User interactions with the information stream may be achieved via the I/O devices 350 and provided to the processing engine 112 and/or other components of the system 100 via the network and/or cloud 120.

To implement various modules, units, and their functionalities described in the present disclosure, computer hardware platforms may be used as the hardware platform(s) for one or more of the elements described herein (e.g., the indoor positioning and navigation system 100, and/or other components of the indoor positioning and navigation system 100 described with respect to FIGS. 1-11). The hardware elements, operating systems and programming languages of such computers are conventional in nature, and it is presumed that those skilled in the art are adequately familiar therewith to adapt those technologies to the management of the supply of service as described herein. A computer with user interface elements may be used to implement a personal computer (PC) or other type of work station or terminal device, although a computer may also act as a server if appropriately programmed. It is believed that those skilled in the art are familiar with the structure, programming and general operation of such computer equipment and as a result the drawings should be self-explanatory.

One of ordinary skill in the art would understand that when an element of the indoor positioning and navigation system 100 performs, the element may perform through electrical signals and/or electromagnetic signals. For example, when a user device 130 processes a task, such as making a determination, identifying or selecting an object, the user device 130 may operate logic circuits in its processor to process such task. When the user device 130 sends out a service request to the server 110, a processor of the service user device 130 may generate electrical signals encoding the service request. The processor of the user device 130 may then send the electrical signals to an output port. If the user device 130 communicates with the server 110 via a wired network, the output port may be physically connected to a cable, which may further transmit the electrical signals to an input port of the server 110. If the user device 130 communicates with the server 110 via a wireless network, the output port of the user device 130 may be one or more antennas, which may convert the electrical signals to electromagnetic signals. Within an electronic device, such as the user device 130, and/or the server 110, when a processor thereof processes an instruction, sends out an instruction, and/or performs an action, the instruction and/or action is conducted via electrical signals. For example, when the processor retrieves or saves data from a storage medium (e.g., the storage 140), it may send out electrical signals to a read/write device of the storage medium, which may read or write structured data in the storage medium. The structured data may be transmitted to the processor in the form of electrical signals via a bus of the electronic device. Here, an electrical signal may refer to one electrical signal, a series of electrical signals, and/or a plurality of discrete electrical signals.

Figure 4:
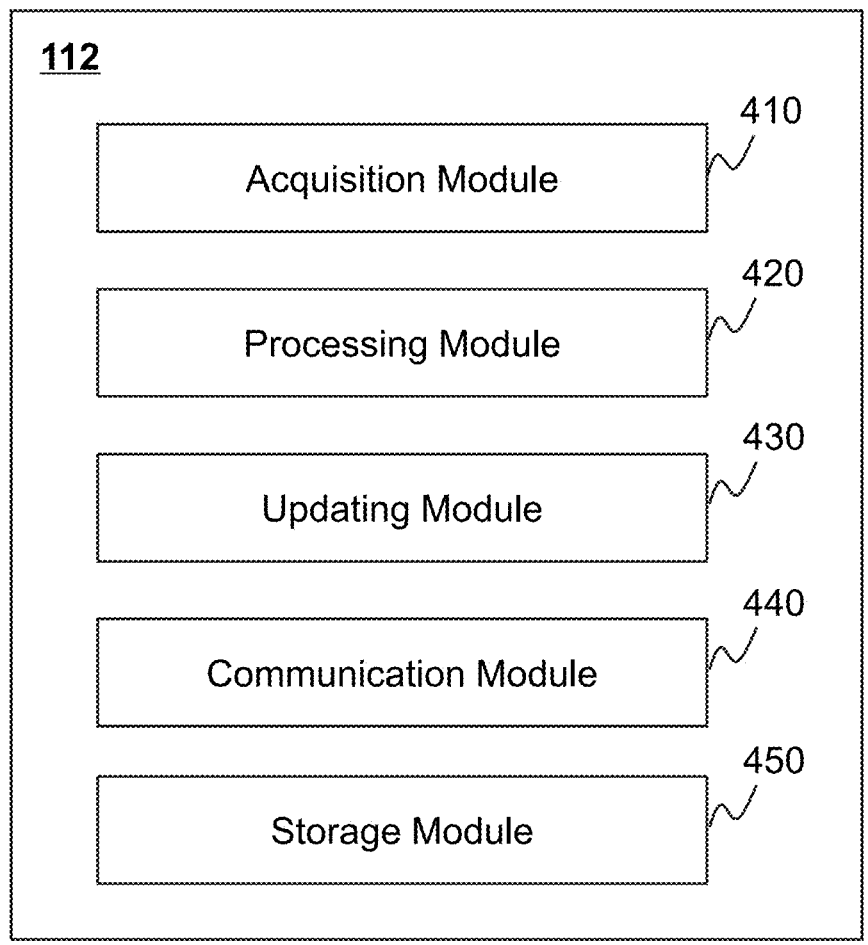
FIG. 4 is a block diagram illustrating an exemplary processing engine according to some embodiments of the present disclosure.

FIG. 4 is a block diagram illustrating an exemplary processing engine according to some embodiments of the present disclosure. The processing engine 112 may be in communication with a computer-readable storage (e.g., the storage 140, the user device 130), and may execute instructions stored in the computer-readable storage medium. In some embodiments, the processing engine 112 may include an acquisition module 410, a processing module 420, an updating module 430, a communication module 440, and a storage module 450.

The acquisition module 410 may be configured to obtain information corresponding to the indoor positioning and navigation system 100. In some embodiments, the acquisition module 410 may obtain a three-dimensional (3D) model of a building. The 3D model of the building may include a plurality of reference locations associated with reference environmental data. The acquisition module 410 may obtain current environmental data corresponding to a current location of the building from a user device 130 at a current time. The acquisition module 410 may receive environmental data of the current location from a plurality of user devices within a predetermined period of time immediately prior to a current time.

The processing module 420 may be configured to process data associated with the indoor positioning and navigation system 100. The processing module 420 may include an identification unit 510, a comparison unit 520, a processing unit 530. The identification unit 510 may be configured to identify a target reference location corresponding to the current location from the plurality of reference locations of the 3D model of the building. The comparison unit 520 may be configured to compare the current environmental data with the target reference environmental data. The processing unit 530 may determine whether the current environmental data of the current location match the target reference environmental data. The processing unit 530 may also determine a first region in the target reference environmental data that corresponds to an un-matched region in the current environmental data, and a second region in the target reference environmental data that corresponds to a matched region in the current environmental data. More descriptions regarding the processing module 420 may be found elsewhere in the present disclosure (e.g., FIG. 5 and the descriptions thereof).

The updating module 430 may be configured to update the 3D model of the building. In some embodiments, the updating module 430 may update the 3D model based on the current environmental data. In some embodiments, the updating module 430 may update the 3D model when the current environmental data statistically un-match the target reference environmental data. In some embodiments, the updating module 430 may update a first region in the target reference environmental data of the 3D model of the building that corresponds to an un-matched region in the current environmental data. For example, the updating module 430 may update the first region in the target reference environmental data of the 3D model of the building based on the un-matched region in the current environmental data to generate the updated 3D model of the building. More particularly, the updating module 430 may first register the matched region in the current environmental data with the second region in the 3D model of the building. The updating module 430 may then register the un-matched region in the current environmental data with the first region in the 3D model of the building, based on the registration of the matched region with the second region, to update the first region of the 3D model of the building. After the registrations of the matched region and un-matched region, the updating module 430 may update the first region in the 3D model of the building based on the un-matched region in the current environmental data.

The communication module 440 may be configured to facilitate a communication between components of the indoor positioning and navigation system 100. In some embodiments, the communication module 440 may send to the user device electrical signals. For example, the communication module 440 may send to the user device electrical signals including the target reference location when the current environmental data match the target reference environmental data. The communication module 440 may send the communication signals to the user device via the internet 120.

The storage module 450 may be configured to store information corresponding to the indoor positioning and navigation system 100. In some embodiments, the storage module 450 may store the current environmental data, the un-matched environmental data, and/or the updated 3D model of the building.

It should be noted that the above description of the processing engine 112 is provided for the purposes of illustration, and is not intended to limit the scope of the present disclosure. For persons having ordinary skills in the art, multiple variations and modifications may be made under the teachings of the present disclosure. However, those variations and modifications do not depart from the scope of the present disclosure. For example, the acquisition module 410 and the processing module 420 may be combined as a single module that obtains and processes data associated with the indoor positioning and navigation system 100.

Figure 5:
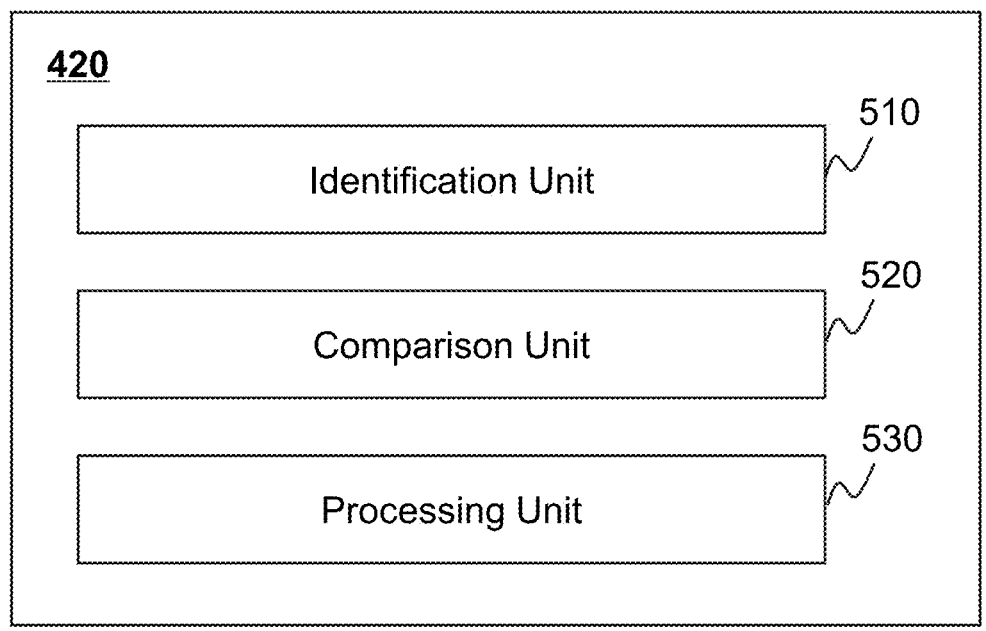
FIG. 5 is a block diagram illustrating an exemplary processing module according to some embodiments of the present disclosure.

FIG. 5 is a block diagram illustrating an exemplary processing module according to some embodiments of the present disclosure. The processing module 420 may include an identification unit 510, a comparison unit 520, a processing unit 530.

The identification unit 510 may be configured to identify a target reference location corresponding to the current location from the plurality of reference locations of the 3D model of the building. In some embodiments, the identification unit 510 may identify the target reference location corresponding to the current location by identifying the target reference environmental data, from the reference environmental data, corresponding to the current environmental data. In some embodiments, the identification unit 510 may compare the current environmental data with the reference environmental data to identify the target reference environmental data. For example, the identification unit 510 may compare the photo of the current location with the reference environmental data of the 3D model of the building.

The comparison unit 520 may be configured to compare the current environmental data with the target reference environmental data. In some embodiments, the comparison unit 520 may compare the current environmental data with the target reference environmental data by comparing a plurality of current feature points in the current environmental data with a plurality of target reference feature points in the target reference environmental data. The comparison unit 520 may determine whether each of the target reference feature point, if there exists, is the same as the corresponding current feature point. In some embodiments, the comparison unit 520 may determine a difference between each of the plurality of current feature points and the corresponding target reference feature point in color or greyscale value.

The processing unit 530 may be configured to determine whether the current environmental data of the current location match the target reference environmental data. The processing unit 530 may determine whether the current feature point matches the target reference feature point. In some embodiments, the processing unit 530 may generate a matching degree between the current environmental data of the building and the target reference environmental data of the 3D model of the building. For example, the processing unit 530 may generate the matching degree based on the difference between each of the plurality of current feature points and the corresponding target reference feature point. The processing unit 530 may determine whether the matching degree is greater than a first threshold. In some embodiments, the processing unit 530 may select some or all of un-matched feature points from the plurality of current feature points. The processing unit 530 may determine an un-matched region in the current environmental data based on the selected some or all un-matched feature points. The processing unit 530 may determine a first region in the target reference environmental data of the 3D model of the building that corresponds to the un-matched region in the current environmental data. The processing unit 530 may determine a matched region in the current environmental data, and a second region in the target reference environmental data of the 3D model of the building that corresponds to the matched region.

Figure 6:
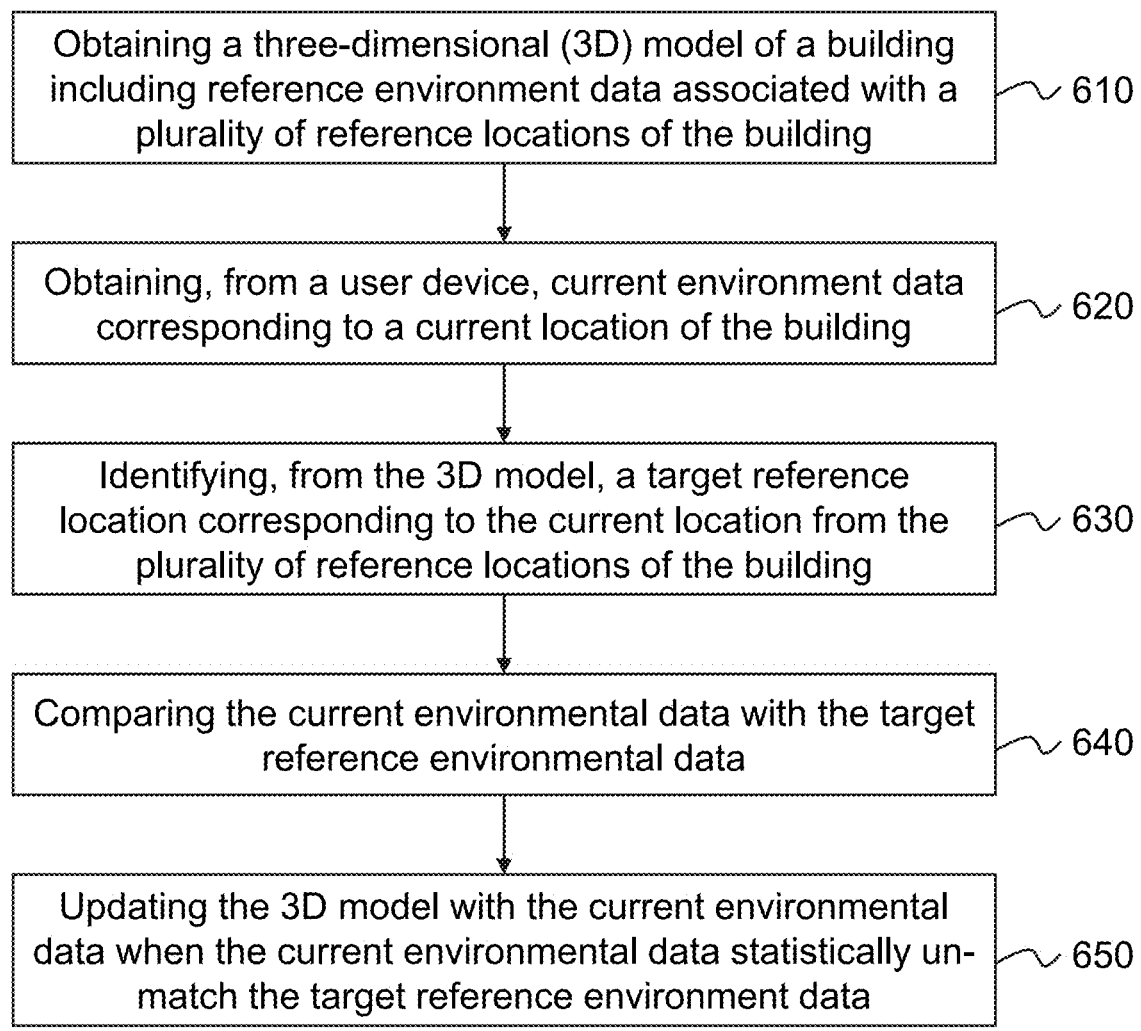
FIG. 6 is a flowchart of an exemplary process for updating a 3D model of a building according to some embodiments of the present disclosure.

FIG. 6 is a flowchart of an exemplary process for updating a 3D model of a building according to some embodiments of the present disclosure. The process 600 may be executed by the indoor positioning and navigation system 100. For example, the process 600 may be implemented as a set of instructions (e.g., an application) stored in a storage (e.g., storage 140, ROM 230, RAM 240, or storage 390). In some embodiments, the set of instructions may be embedded in a memory. A processor (e.g., server 110, processing engine 112, or processor 220, CPU 340) may execute the set of instructions, and when executing the instructions, it may be configured to perform the process 600. The operations of the illustrated process presented below are intended to be illustrative. In some embodiments, the process 600 may be accomplished with one or more additional operations not described and/or without one or more of the operations discussed. Additionally, the order in which the operations of the process as illustrated in FIG. 6 and described below is not intended to be limiting.

In 610, the acquisition module 410 may obtain a three-dimensional (3D) model of a building. In some embodiments, the building may be enclosed or semi-enclosed. For example, the enclosed building may be a building fully or substantially covered by walls, windows, ceilings, etc., such as but not limited to a shopping center, an office building, a skyscraper, an airport terminal, etc., and the semi-enclosed building may include but not limited to an indoor parking garage, a stadium or a building that is partially covered by walls and ceilings, or the like, or any combination thereof. The 3D model of the building may be a model of an internal structure of a building. The 3D model of the building may include a plurality of reference locations of the building. The reference locations may include floors, corners, walls, ceilings, etc. For example, each of walls in the building may be considered as a reference location. The distance between each two reference locations may be same or different. In some embodiments, the 3D model of the building may be associated with reference environmental data. Each of the reference locations may be associated with a portion of the reference environmental data (or referred to as candidate environmental data). In some embodiments, the 3D model may include a point cloud model, a mesh model, a wireframe model, a surface model, a solid model, or the like, or any combination thereof.

The 3D model of the building may be used, by the indoor positioning and navigation system 100, to provide the indoor positioning and navigation service for the user device 130. In some embodiments, wireless signals (e.g., WIFI, GPS, Cellular network, Bluetooth) at some locations of the building may be absorbed or blocked by the ceiling or walls of the building and become very poor. People (e.g., a user of the user device 130) at these locations may be unable to find their locations and routes easily because most of the conventional navigation system or map requires wireless signals. Even if the wireless signals are good, a positioning technology (e.g., a WIFI positioning technology, a GPS positioning technology, a Bluetooth positioning technology) may be inaccurate in the building.

In some embodiments, the 3D model (e.g., a point cloud model) of the building may be generated by the processor. In some embodiments, the processor may collect the reference environmental data associated with the plurality of reference locations of the building. Each of the plurality of reference locations of the building may correspond to a part of the building. For example, the processor may collect a plurality of images (e.g., photos) or a video (which includes a plurality of frames of images) of the building. Each of the plurality of reference locations of the building may be a part of the building shown in at least one of the plurality of images of the building. In some embodiments, a reference location may appear in multiple images.

In some embodiments, the processing engine 112 may generate the 3D model, based on the plurality of images of the building, using a 3D modelling algorithm. The 3D modelling algorithm may include but not limited to a structure from motion (SFM) algorithm, a scale invariant feature transform (SIFT) algorithm, an ANN feature matching algorithm, a random sample consensus (RANSAC) algorithm, or the like, or any combination thereof. In some embodiments, the processing engine 112 may collect the reference environmental data by a camera, a laser device (e.g., a Light Detection and Ranging (LiDAR) device), an ultrasonic device, a radar device, or the like, or any combination thereof. In some embodiments, the 3D model of the building may be stored in the storage 140. The processing engine 112 may acquire the 3D model from the storage 140.

In 620, the acquisition module 410 may obtain, from a user device, current environmental data corresponding to the user device. In some embodiments, the current environment corresponding to the current environmental data may be a part of the building that a user device is currently detecting. In some embodiments, a user device of the user may continuously capture photos or take a video of the locations in front of him/her in the building. The capturing angle of the user device may be aligned with the user's viewing angle (e.g., the user may hold the user device in his/her hands). Alternatively, the capturing angle of the user device may be fixed (e.g., the user device may be mounted on the user's vehicle) and the current location may change continuously while the vehicle is moving. The current environment of the building may be a location of the building (i.e., a current location of the building) shown on the photo or video in real time. In some embodiments, the current environmental data corresponding to the current location of the building may include a plurality of environmental details. The environmental details of the current location may include a ceiling, a wall, a pillar, a door, an object (e.g., a switch, a poster, a symbol, a chair, a table, etc.), or the like, or any combination thereof. The information corresponding to an environmental detail may include a shape of the environmental detail, a size of the environmental detail, a color of the environmental detail, or the like, or any combination thereof. In some embodiments, a plurality of current feature points may correspond to the environmental details in the photo taken by the user device 130. For example, the plurality of current feature points may include an edge point of the environmental detail, an endpoint of the environmental detail, a point having a relative large color or greyscale value difference with points nearby, or the like, or any combination thereof.

In some embodiments, the acquisition module 410 may receive and accept a connection request from the user device 130. When receiving the connection request, the processing engine 112 may be able to obtain information transmitted from the user device 130. In some embodiments, the processing engine 112 may detect an application (e.g., a customer application) executing on the user device. The customer application may collect environmental information of the user device 130 from one or more sensors of the user device 130 and automatically communicate with the system (e.g., the navigation system 100) over the network and/or cloud 120. The processing engine 112 may communicate with the customer application executing on the user device 130 to receive a positioning request (e.g., a request for using the positioning and/or the navigation service). In some embodiments, the acquisition module 410 may obtain, from the customer application of the user device, current environmental data corresponding to the current location of the building based on the environmental information detected by the one or more sensors of the user device.

In some embodiments, the user device 130 may obtain the current environmental data by a sensor. The sensor may include but not limited to a camera, a laser sensor, an ultrasonic sensor, a radar sensor, or the like, or any combination thereof. The sensor may be mounted on or integrated in the user device 130. In some embodiments, the user device may transmit the current environmental data (e.g., one or more photos) to the processing engine 112 via a wireless communication (e.g., an Internet, an intranet, a local area network, a Bluetooth network, etc.). The user device 130 may transmit the current environmental data to the processing engine 112 in real-time or substantially real-time. In some embodiments, the user device 130 may locate in a place that does not have wireless signals sufficiently strong for transmitting the current environmental data or a place that the strength of the wireless signals is varying. In this case, the user device 130 may store the current environmental data when the wireless signals are weak and transmit when the wireless signals are strong. In some embodiments, the user device 130 may transmit the current environmental data to the processing engine 112 only when the user permits the user device to do so (e.g., by pressing a transmitting button on user device). In some embodiments, the user device 130 may compare the current environmental data with the reference environmental data of a 3D model of the building stored in the user device 130, and the user device 130 may obtain target reference environmental data corresponding to the current environmental data. The user device 130 may only transmit the current environmental data that are un-matched with the target reference environmental data of the 3D model of the building stored in the user device to the processing engine 112. In some embodiments, the current environmental data may be pre-processed before transmitted to the processing engine 112. For example, a photo of the current location may be compressed before transmitted to the processing engine 112.

In 630, the identification unit 510 may identify a target reference location corresponding to the current location from the plurality of reference locations of the 3D model of the building. In some embodiments, the target reference location may correspond to target reference environmental data. The target reference environmental data may be a portion of the reference environmental data. The target reference environmental data may include a plurality of target reference feature points corresponding to environmental details of the target reference locations.

In some embodiments, the identification unit 510 may identify the target reference location corresponding to the current location by identifying the target reference environmental data, from the reference environmental data, corresponding to the current environmental data. The target reference environmental data may include the highest number of environmental details, among the reference environmental data, that are similar to the environmental details in the current environmental data.

In some embodiments, the identification unit 510 may compare the current environmental data with the reference environmental data to identify the target reference environmental data. For example, the identification unit 510 may compare the photo of the current location with the reference environmental data of the 3D model of the building. A location of the 3D model of the building that are most similar to the photo of the current location (e.g., with the highest number of similar environmental details) may be identified as the target reference location. In some embodiments, the 3D model may include a plurality of reference locations, each corresponding to a portion of the reference environmental data (also referred to as candidate environmental data). For example, the identification unit 510 may compare the current environmental data at the current location with the candidate environmental data at each of the plurality of reference locations. Each comparison may include comparing the number of environmental details and a shape, a color, a size of each of the environmental details in the current environmental data with each candidate environmental data. Two environmental details in the current environmental data and the candidate environmental data, respectively are considered similar when the similarity of each of the shape, the color, or the size between the two environmental details is larger than a second threshold (e.g., 70%, 80%, 90%). For example, when the current environment includes two black cylindrical pillars and a white rectangular pillar, the corresponding current environmental data may include two black cylindrical pillars and a white rectangular pillar. The reference environmental data which correspond to the whole 3D model may include a plurality of pillars with different colors and shapes. The 3D model may include a plurality of reference locations, each corresponding to candidate environmental data with a number of pillars. The identification unit 510 may identify candidate environmental data with two black cylindrical pillars and a white rectangular pillar (or one black cylindrical pillar and one while rectangular pillar if other candidate environmental data contain even less similar pillars) as target reference environmental data.

In 640, the comparison unit 520 may compare the current environmental data with the target reference environmental data. In some embodiments, the target reference environmental data may include a plurality of target reference feature points corresponding to environmental details of the target reference locations. The current environmental data may include a plurality of current feature points corresponding to environmental details of a current location. In some embodiments, the comparison unit 520 may compare the current environmental data with the target reference environmental data by comparing the plurality of current feature points with the plurality of target reference feature points. More descriptions regarding the comparison between the current environmental data and the target reference environmental data may be found elsewhere in the present disclosure (e.g., FIG. 7 and the descriptions thereof).

In some embodiments, the communication module 440 may send to the user device communication signals including the target reference location when the current environmental data match the target reference environmental data. The communication module 440 may send the communication signals to the user device via the internet 120. In some embodiments, a location of the user device may be determined based on the target reference location corresponding to the current location of the building. As used herein, the location of the user device may be a location where the user stands at, while the current location of the building may be a location where the user device is detecting or taking photos on. The location of the user device may be determined by a perspective-n-point (PNP) method based on the target reference location and the current environmental data. In some embodiments, the user device may provide an indoor positioning and navigation service (e.g., an indoor augmented reality (AR) navigation service) to the user according to the location of the user device and a destination of the user. In some embodiments, an application may be installed in the user device 130. The application may include maps associated with a plurality of cities, roads, buildings, etc. The communication signals sent by the communication module 440 may include a name of a city, a name of a road, and a name of a building that the user device 130 locates at. The application may control the user device 130 to display a corresponding map on a display interface of the user device 130. The communication signals may further include a coordinate of the user device 130 in the building and the application may control the user device 130 to display a symbol (e.g., a circle, a dot) on the corresponding coordinates of the map to represent the location of the user device. In some embodiments, the communication signals may further include a route from the location of the user device 130 to the destination. For example, coordinates of some or all locations along the route may be stored in the communication signals. The user device 130 may display the route on the map by connecting and displaying the locations along the route based on their coordinates.

In some embodiments, the application may be an augmented reality (AR) application. For example, the AR application may control the user device 130 to display a real-time video that is continuously captured by a camera of the user device 130. The AR application may determine the location of the user device 130 based on the communication signals and may determine a distance from the upcoming intersection and a direction that the user device should take at the intersection based on the route. The AR application may control the user device 130 to display an arrow on the real-time video corresponding to the direction and a distance from the intersection on the display interface of the user device 130.

In 650, the updating module 430 may update the 3D model with the current environmental data when the current environmental data statistically un-match the target reference environmental data. In some embodiments, the acquisition module 410 may receive environmental data of the current location from a plurality of other user devices within a predetermined period of time immediately prior to a current time. The processing engine 112 (e.g., the identification unit 510, and/or the comparison unit 520) may compare the environmental data from different user devices of the plurality of other user devices with the current environmental data. The processing engine 112 may also compare the environmental data from different user devices of the plurality of other user devices with the corresponding reference environmental data. The processing unit 530 may determine that the current environmental data of the current location statistically un-match the target reference environmental data when the environmental data from different user devices all match with the current environmental data (i.e. the user devices are taking the same photos) but the environmental data from different user devices and the current environmental data don't match with the target reference environmental data. In some embodiments, the processing unit 530 may determine that the current environmental data of the current location statistically un-match the target reference environmental data when the environmental data from different user devices match with the current environmental data for more than a third threshold but the environmental data from different user devices and the current environmental data don't match with the target reference environmental data for more than a fourth threshold. For example, a 3D model may be constructed immediately after a building is built, and it may contain no poster therein. Several days later, a poster may be pasted on a wall and a plurality of user devices may capture photos of the wall with the poster on it. The plurality of user devices may send the photos to a server and the server may identify the wall (without the poster) from all the walls in the 3D model (e.g., based on the environmental details such as size, shapes, texture, color, other objects on the wall) as the target reference location. The processing module 420 may determine that the current environmental data of the current location statically un-match the target reference environmental data because all the photos captured by the user devices are the same (e.g., containing the poster) and are different from the target reference environmental data which does not contain the poster. Then the updating module 430 may update the 3D model based on the current environmental data (e.g., by adding a poster on the 3D model). In some embodiments, the third threshold may vary between 90% and 100%. The fourth threshold may vary between 30% and 70%.

Figure 7:
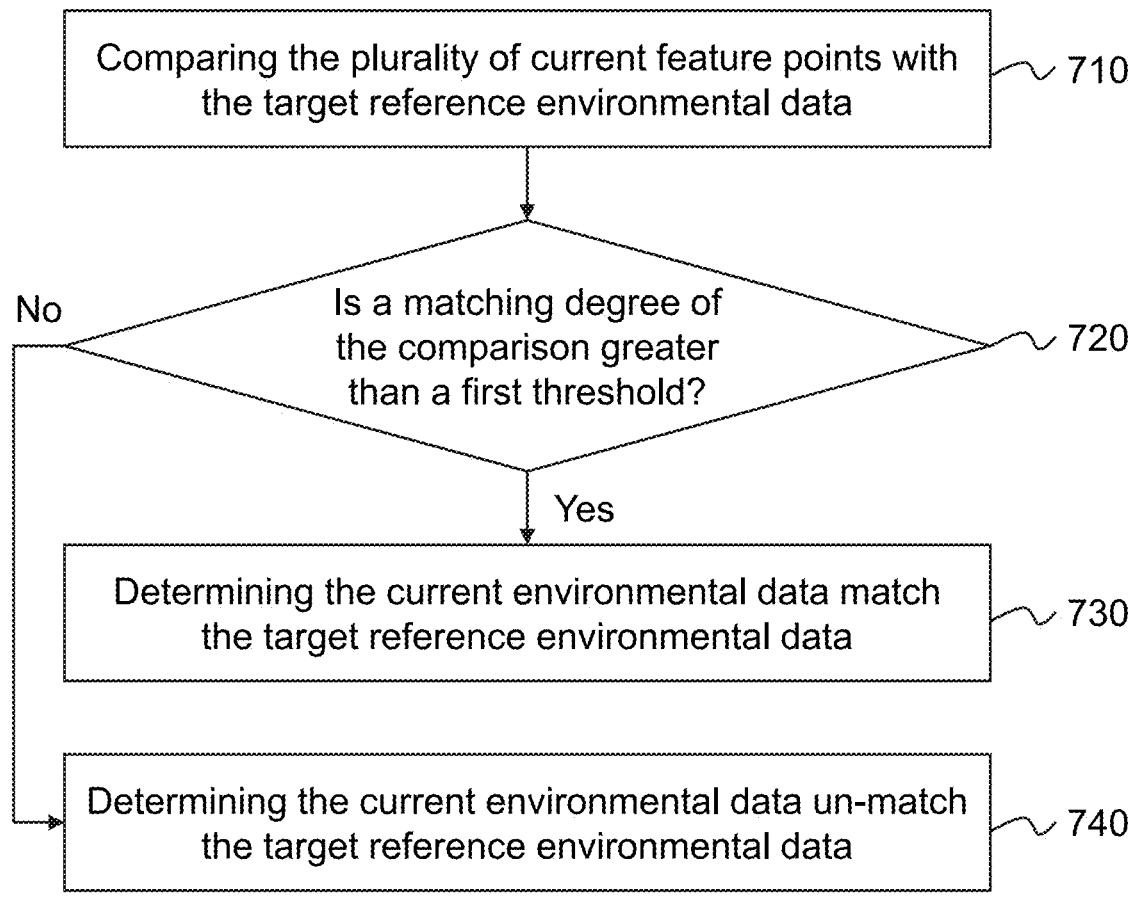
FIG. 7 is a flowchart of an exemplary process for comparing the current environmental data with the target reference environmental data.

FIG. 7 is a flowchart of an exemplary process for comparing the current environmental data with the target reference environmental data. Based on the comparison, the processing engine 112 may determine whether the current environmental data matches the target reference environmental data. The process 700 may be executed by the indoor positioning and navigation system 100. For example, the process 700 may be implemented as a set of instructions (e.g., an application) stored in a storage (e.g., storage 140, ROM 230, RAM 240, or storage 390). In some embodiments, the set of instructions may be embedded in a memory. A processor (e.g., server 110, processing engine 112, or processor 220, CPU 340) may execute the set of instructions, and when executing the instructions, it may be configured to perform the process 700. The operations of the illustrated process presented below are intended to be illustrative. In some embodiments, the process 700 may be accomplished with one or more additional operations not described and/or without one or more of the operations discussed. Additionally, the order in which the operations of the process as illustrated in FIG. 7 and described below is not intended to be limiting.

In 710, the comparison unit 520 may compare the plurality of current feature points with the target reference environmental data. In some embodiments, each of the plurality of current feature points may be a point in the current environmental data. Each of the plurality of current feature points may correspond to a target reference feature point (if there exists) in the target reference environmental data. The comparison unit 520 may determine whether each of the target reference feature point is the same as the corresponding current feature point. As used herein, two points are considered to be the "same as" each other, if their coordinates and greyscale values or colors are same.

In some embodiments, when a current feature point is the same as a corresponding target reference feature point (e.g., same color and/or greyscale value), the processing unit 530 may determine that the current feature point matches the target reference feature point. In some embodiments, when a current feature point in a current location is different from a target reference feature point in a target reference location corresponding to the current location, the processing unit 530 may determine that the current feature point un-matches the target reference feature point. Alternatively, the comparison unit 520 may determine a difference between each of the plurality of current feature points and the corresponding target reference feature point in color or greyscale value. When a difference between a current feature point and the corresponding target reference feature point is less than a fifth threshold, the processing unit 530 may determine that the current feature point matches the target reference point. Otherwise, the processing unit 530 may determine that the current feature point un-matches the target reference point. In some embodiments, when there is no target reference feature point in the target reference location point corresponding to the current location point, the processing unit 530 may determine that the current feature point is un-matched.

In some embodiments, the processing unit 530 may generate a matching degree between the current environmental data of the building and the target reference environmental data of the 3D model of the building. For example, the processing unit 530 may generate the matching degree based on the difference between each of the plurality of current feature points and the corresponding target reference feature point. The matching degree may be a ratio of a number of matched current feature points to a total number of the plurality of current feature points of the current environmental data corresponding to the current location of the building. In some embodiments, the current location of the building may be divided into several regions. A matching degree of a region may be generated as a ratio of a count of matched current feature points in the region to a count of current feature points in the region.

In 720, the processing unit 530 may determine whether the matching degree is greater than a first threshold. In some embodiments, the matching degree may be a ratio of the number of the matched feature points to the number of the plurality of current feature points. In some embodiments, the first threshold may vary between 50% and 90%. For example, the first threshold may be 50%, 60%, 70%, 80% or 90%. When the matching degree of the comparison is greater than the first threshold, the process 700 may proceed to 730. Otherwise, the process 700 may proceed to 740.

In 730, the processing unit 530 may determine that the current environmental data match the target reference environmental data. In other words, the current location, corresponding to the current environmental data, is determined to be the same or substantially the same as the target location, corresponding to the target reference environmental data.

In 740, the processing unit 530 may determine that the current environmental data un-match the target reference environmental data. In other words, the current location, corresponding to the current environmental data, is determined to be different from the target location, corresponding to the target reference environmental data.

Figure 8:
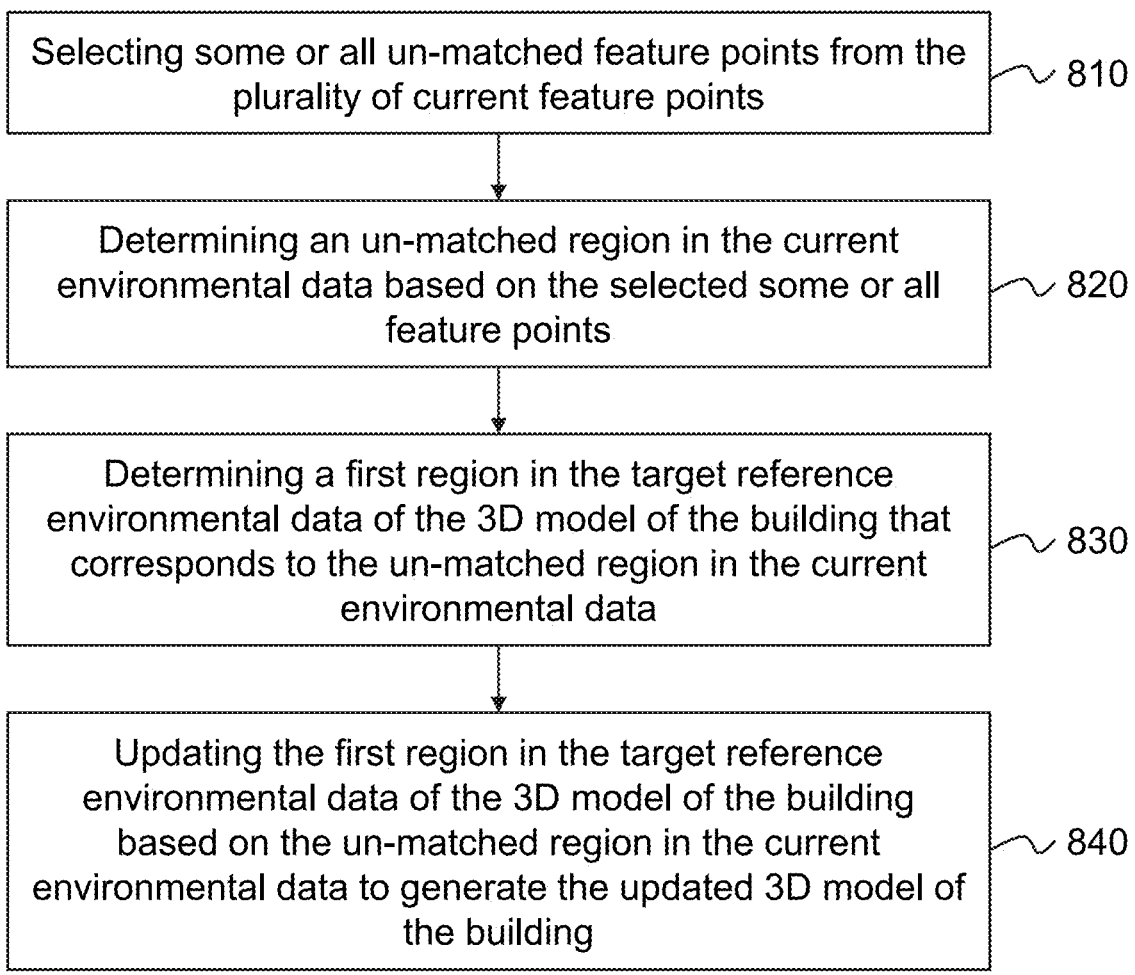
FIG. 8 is a flowchart of updating the 3D model of the building according to some embodiments of the present disclosure.

FIG. 8 is a flowchart of an exemplary process for updating the 3D model of the building according to some embodiments of the present disclosure. The process 800 may be executed by the indoor positioning and navigation system 100. For example, the process 800 may be implemented as a set of instructions (e.g., an application) stored in a storage (e.g., storage 140, ROM 230, RAM 240, or storage 390). In some embodiments, the set of instructions may be embedded in a memory. A processor (e.g., server 110, processing engine 112, or processor 220, CPU 340) may execute the set of instructions, and when executing the instructions, it may be configured to perform the process 800. The operations of the illustrated process presented below are intended to be illustrative. In some embodiments, the process 800 may be accomplished with one or more additional operations not described and/or without one or more of the operations discussed. Additionally, the order in which the operations of the process as illustrated in FIG. 8 and described below is not intended to be limiting.

In 810, the processing unit 530 may select some or all of un-matched feature points from the plurality of current feature points. For example, the processing unit 530 may determine a plurality of un-matched feature points from the plurality of current feature points. The un-matched feature points may correspond to one or more regions (also referred to as un-matched regions) in the current environmental data. In some embodiments, the un-matched feature points may also include some error points. The error points may be isolated and operation 810 may include selecting some or all of the un-matched feature points that are not isolated. More descriptions regarding the un-matched feature points may be found elsewhere in the present disclosure (e.g., FIG. 7 and the descriptions thereof).

In 820, the processing unit 530 may determine an un-matched region in the current environmental data based on the selected some or all feature points. In some embodiments, the un-matched region may be a region in the current environmental data that contains the selected un-matched feature points. The un-matched region may be a regular region or an irregular region. For example, a shape of the un-matched region may be a circle, a square, a rectangle, a triangle, a star, or the like, or any combination thereof.

In 830, the processing unit 530 may determine a first region in the target reference environmental data of the 3D model of the building that corresponds to the un-matched region in the current environmental data. A shape and a size of the first region may be the same as the un-matched region. A location of the first region in the target reference environmental data of the 3D model of the building may correspond to a location of the un-matched region in the current environmental data. For example, the un-matched region may be a 15×15 pixels region in the center of the current environmental data. In this case, the first region may be a 15×15 pixels region in the center of the target reference environmental data of the 3D model of the building correspondingly.

In 840, the updating module 430 may update the first region in the target reference environmental data of the 3D model of the building based on the un-matched region in the current environmental data to generate the updated 3D model of the building. In some embodiments, the updating module 430 may update the first region in the target reference environmental data by replacing the first region by the un-matched region in the current environmental data. For example, all target reference feature points in the first region in the target reference environmental data may be updated based on the corresponding current feature points in the un-matched region in the current environmental data. More descriptions regarding updating the first region based on the un-matched region may be found elsewhere in the present disclosure (e.g., FIG. 9 and the descriptions thereof).

Figure 9:
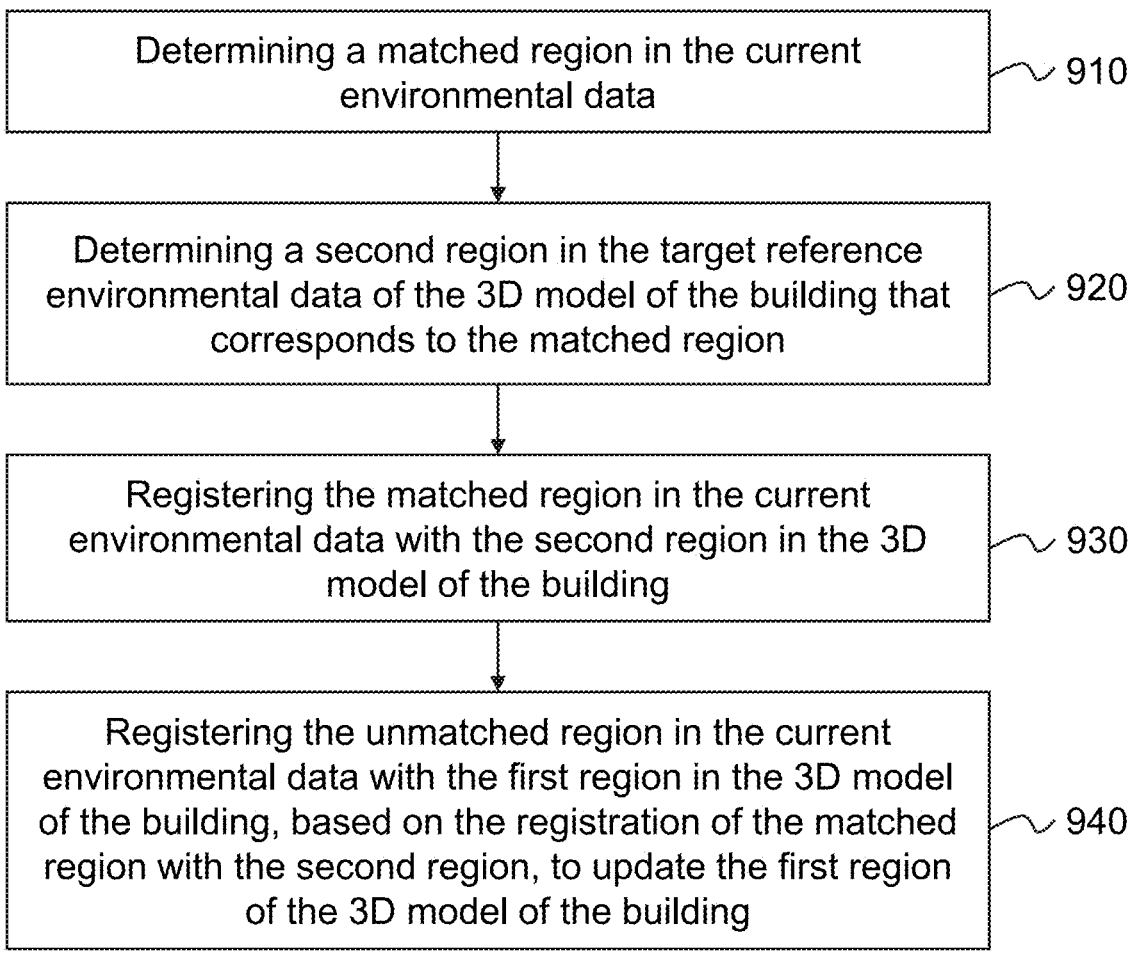
FIG. 9 is a flowchart of updating the first region in the 3D model of the building based on the un-matched region in the current environmental data according to some embodiments of the present disclosure.

FIG. 9 is a flowchart of updating the first region in the 3D model of the building based on the un-matched region in the current environmental data according to some embodiments of the present disclosure. The process 900 may be executed by the indoor positioning and navigation system 100. For example, the process 900 may be implemented as a set of instructions (e.g., an application) stored in a storage (e.g., storage 140, ROM 230, RAM 240, or storage 390). In some embodiments, the set of instructions may be embedded in a memory. A processor (e.g., server 110, processing engine 112, or processor 220, CPU 340) may execute the set of instructions, and when executing the instructions, it may be configured to perform the process 900. The operations of the illustrated process presented below are intended to be illustrative. In some embodiments, the process 900 may be accomplished with one or more additional operations not described and/or without one or more of the operations discussed. Additionally, the order in which the operations of the process as illustrated in FIG. 9 and described below is not intended to be limiting.

In 910, the processing unit 530 may determine a matched region in the current environmental data. In some embodiments, the matched region may be adjacent to the un-matched region. For example, the matched region may border to the un-matched region. In some embodiments, the matched region may be apart from the un-matched region. A matching degree (e.g., described in FIG. 7 and the descriptions thereof) of the feature points in the matched region may be relatively high (e.g., 90%, 95%). In some embodiments, the matched region may be a regular region or an irregular region. For example, a shape of the matched region may be a circle, a square, a rectangle, a triangle, or the like, or any combination thereof.

In 920, the processing unit 530 may determine a second region in the target reference environmental data of the 3D model of the building that corresponds to the matched region. A shape and a size of the second region may be the same with the matched region. A location of the second region in the target reference environmental data of the 3D model of the building may correspond to a location of the matched region in the current environmental data.

In 930, the updating module 430 may register the matched region in the current environmental data with the second region in the 3D model of the building. In some embodiments, the updating module 430 may match the current environmental data with the target reference environmental data based on the registration of the matched region with the second region. For example, each of the plurality of current feature points may correspond to a target feature point based on the registration.

In 940, the updating module 430 may register the un-matched region in the current environmental data with the first region in the 3D model of the building, based on the registration of the matched region with the second region, to update the first region of the 3D model of the building. In some embodiments, the updating module 430 may update the first region in the 3D model of the building based on the un-matched region in the current environmental data. For example, all target reference feature points in the first region in the target reference environmental data may be updated based on the corresponding current feature points in the un-matched region in the current environmental data. In some embodiments, some of the target reference feature points in the first region (e.g., 5%, 10%) are matched with the corresponding current feature points. In this case, these matched target reference feature points in the first region may be unchanged, while other target reference feature points (which are unmatched feature points) may be updated based on the corresponding current feature points.

FIGS. 10A-10E are schematic diagrams illustrating an exemplary process for updating a 3D model of the building according to some embodiments of the present disclosure.

Figure 10A:
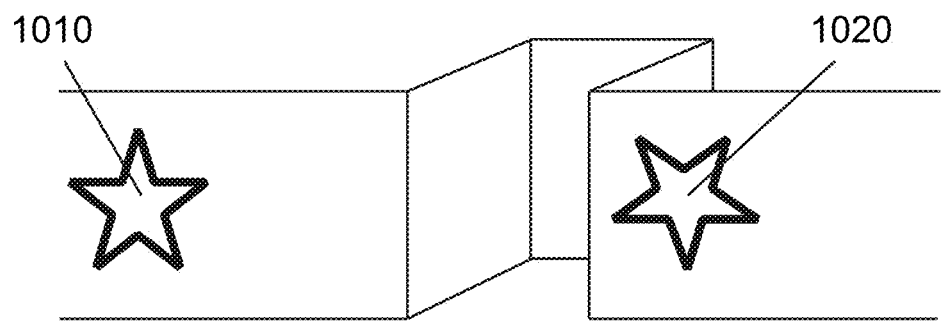
FIGS. 10A-10E are schematic diagrams illustrating an exemplary process for updating a 3D model of the building according to some embodiments of the present disclosure.

FIG. 10A shows a part of a building. As shown in FIG. 10A, a parapet in the building may include two star symbols (i.e. a normal star symbol 1010 on the left, and a reverse star symbol 1020 on the right).

Figure 10B:
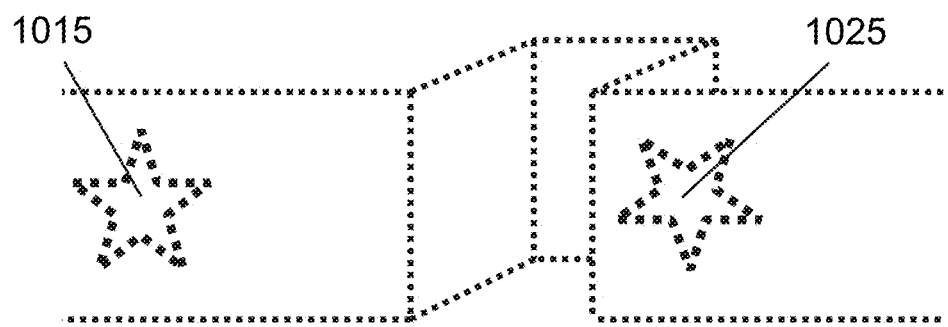
Figure 10C:
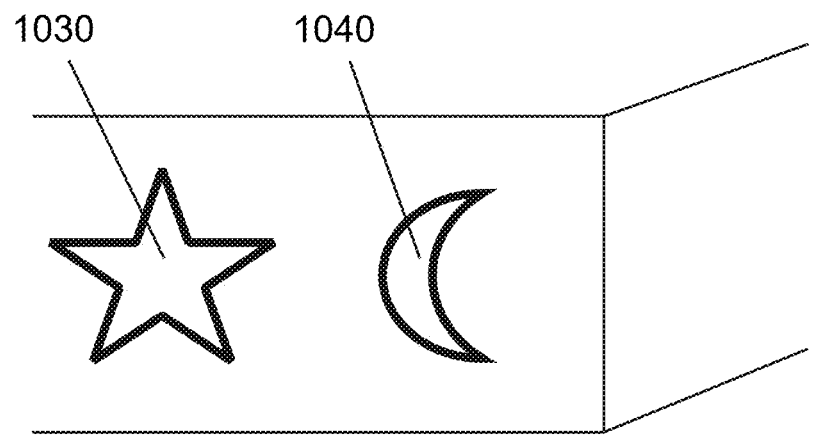

FIG. 10B shows a 3D model of the building (e.g., a 3D model of the parapet). As shown in FIG. 10B, the 3D model of the parapet may be a point cloud model, which including a plurality of reference feature points corresponding to environmental details (e.g., the parapet, a normal star symbol 1015, a reverse star symbol 1025). The normal star symbol 1015 (or the reverse star symbol 1025) is a 3D model of the normal star symbol 1010 (or the reverse star symbol 1020) in the building.

FIG. 100 shows a photo taken by a user device (i.e., the current environmental data). As shown in FIG. 100, a parapet in the photo may include a normal star symbol 1030 and a moon symbol 1040. The moon symbol 1040 may be installed on the parapet recently and the 3D model haven't been updated to include the moon symbol.

Figure 10D:
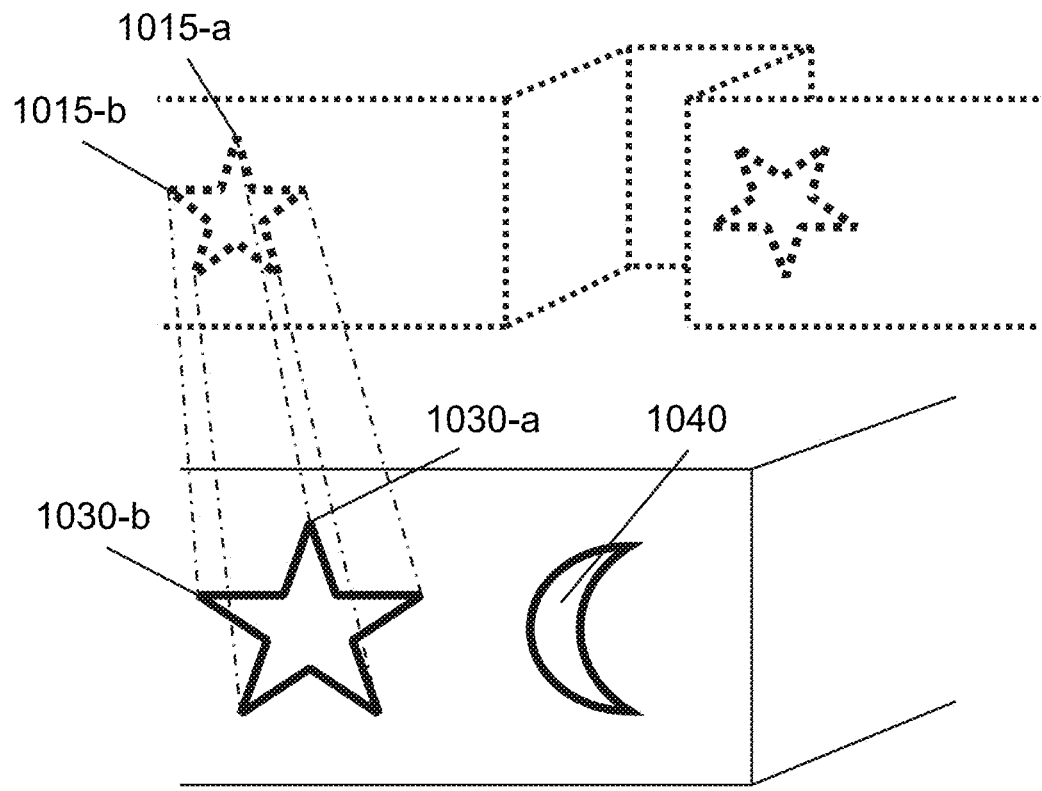

FIG. 10D shows a process for matching the photo (as shown in FIG. 100) with the 3D model of the building (as shown in FIG. 10B). The processing engine 112 may identify that the left side of the 3D model of the parapet corresponds to the photo (e.g., a reference location associated with the left side of the 3D model includes the highest number of environmental details (e.g., the normal star 1015) that are similar to the environmental details (e.g., the normal star 1030) in the photo). The processing engine 112 may compare the photo with the left side of the 3D model of the parapet by comparing a plurality of current feature points (e.g., a feature point 1030-*a*, 1030-*b*) with a plurality of target reference feature points (e.g., a feature point 1015-*a*, 1015-*b*). In some embodiments, the processing engine 112 may determine that the photo un-match the left side of the 3D model. The processing engine 112 may update the 3D model of the parapet by updating the left side of the 3D model based on the photo. In some embodiments, the processing engine 112 may determine a region, including the normal star symbol 1030, as a matched region, and determine a region, including the moon symbol 1040 as an un-matched region. The processing engine 112 may firstly register the matched region with a corresponding region in the 3D model of the parapet, and register the un-matched region with a corresponding region based on the registration of the matched region to update the 3D model of the parapet.

Figure 10E:
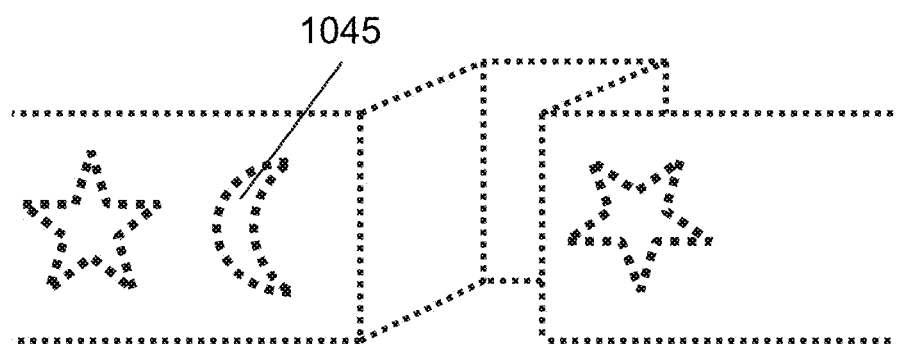

FIG. 10E shows an updated 3D model of the parapet. As shown in FIG. 10E, the parapet in the updated 3D model of the parapet may include a moon symbol 1045 (i.e., a 3D model of the moon symbol 1040).

Figure 11:
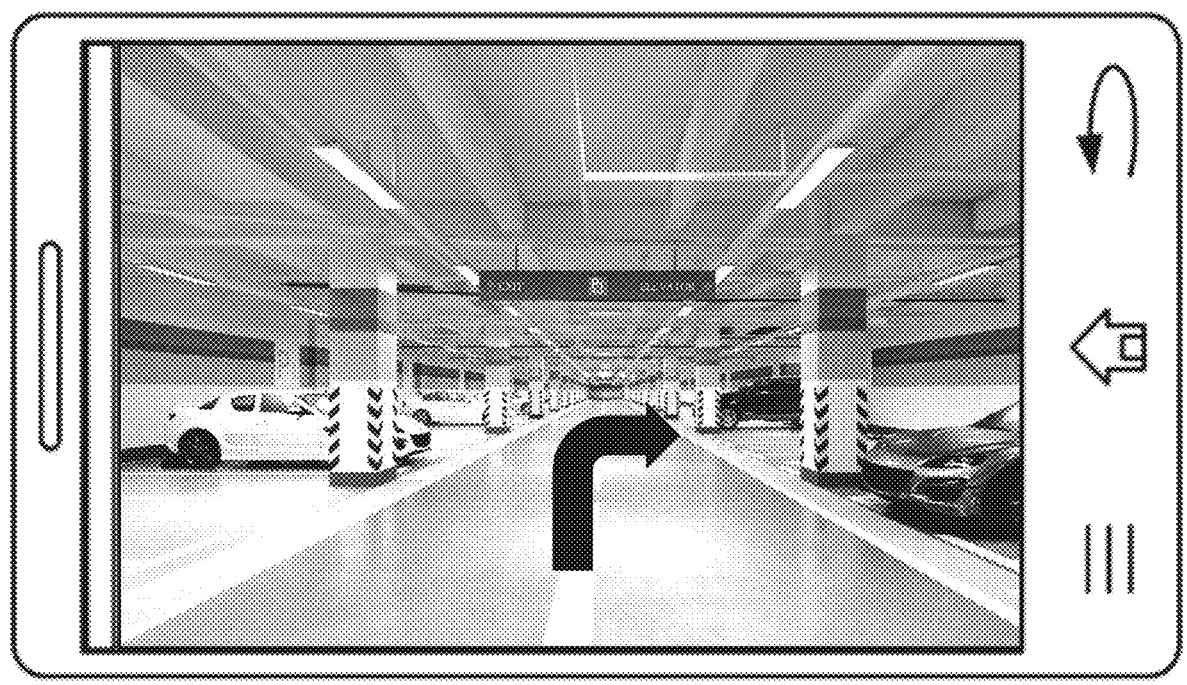
FIG. 11 is a schematic diagram illustrating an exemplary screen interface of a user device associated with an indoor positioning and navigation service according to some embodiments of the present disclosure.

FIG. 11 is a schematic diagram illustrating an exemplary screen of a user device with an indoor positioning and navigation service application according to some embodiments of the present disclosure. As shown in FIG. 11, when a user is using the indoor positioning and navigation service, the user device may continually take photos (e.g., take a video) of the current environmental data. The user device (e.g., a processor in the user device 130) may compare the photos with a 3D model of the building stored in the user device, and determine a location of the user device. The user device may provide an AR navigation service (e.g., showing a guiding arrow in the photos) for guiding the user to a destination. In some embodiments, the user device may transmit the current environmental data (e.g., one or more photos) to the processing engine 112 (e.g., in real-time, or when the wireless signals are strong). If the current environmental data un-match the 3D model of the building, the processing engine 112 may update the 3D model of the building based on the current environmental data.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment," "one embodiment," or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "block," "module," "engine," "unit," "component," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 1703, Perl, COBOL 1702, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a software as a service (SaaS).

Furthermore, the recited order of processing elements or sequences, or the use of numbers, letters, or other designations, therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software-only solution—e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claimed subject matter may lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and describe.

We claim:

1. A system, comprising:
   at least one storage medium including a set of instructions for updating a model of a building;
   at least one processor in communication with the at least one storage medium, wherein when executing the set of instructions, the at least one processor is directed to:
   obtain a three-dimensional (3D) model of a building including reference environmental data associated with a plurality of reference locations of the building;
   obtain, from a user device, current environmental data corresponding to a current location of the building;
   identify, from the reference environmental data, target reference environmental data corresponding to the current environmental data, wherein the target reference environmental data includes a highest number of environmental details, among the reference environmental data, that are similar to environmental details in the current environmental data;
   identify, from the 3D model, the reference location that corresponds to the target reference environmental data as a target reference location corresponding to the current location;
   compare the current environmental data with the target reference environmental data;
   send to the user device the target reference location when the current environmental data match the target reference environmental data; and
   update the 3D model with the current environmental data when the current environmental data statistically un-match the target reference environmental data, wherein the at least one processor is further directed to:
      receive environmental data of the current location from a plurality of other user devices within a predetermined period of time immediately prior to a current time;
      compare the environmental data of the current location received from the plurality of other user devices with the current environmental data of the current location;
      compare the environmental data of the current location received from the plurality of other user devices with the target reference environmental data; and
      in response to a determining that the environmental data of the current location received from the plurality of other user devices match with the current environmental data of the current location for more than a third threshold, and the environmental data of the current location received from the plurality of other user devices and the current environmental data of the current location do not match the target reference environmental data for more than a fourth threshold, determine that the current environmental data of the current location statistically un-match the target reference environmental data.

2. The system of claim 1, wherein the 3D model of the building is a point cloud model or a mesh model, wherein the target reference environmental data includes a plurality of target reference feature points corresponding to environmental details of the target reference location; and
   the current environmental data includes a plurality of current feature points corresponding to environmental details of the current location.

3. The system of claim 2, wherein to compare the current environmental data with the target reference environmental data, the at least one processor is directed to:
   compare the plurality of current feature points with the target reference feature points;

determine the current environmental data match the target reference environmental data when the comparison returns a matching degree greater than a first threshold; and determine the current environmental data un-match the target reference environmental data when the comparison returns the matching degree less than or equal to the first threshold.

4. The system of claim 3, wherein to compare the plurality of current feature points with the plurality of target reference feature points, the at least one processor is further directed to:

match each of the plurality of current feature points with one of the plurality of target reference feature points;

determine a difference between a color or a greyscale value of each of the plurality of current feature points and a color or greyscale value of a matched point in the plurality of target reference feature points; and generate the matching degree between the current environmental data of the building and the target reference environmental data of the 3D model of the building based on the difference.

5. The system of claim 4, wherein after determining that the current environmental data statistically un-match the target reference environmental data the at least one processor is further directed to:

determine a plurality of un-matched feature points, wherein the color or the greyscale value of each of the plurality of un-matched points is different from the color or the greyscale value of the corresponding target reference feature point;

select some or all un-matched feature points from the plurality of un-matched feature points; and determine an un-matched region in the current environmental data based on the selected some or all un-matched feature points.

6. The system of claim 5, wherein to update the 3D model of the building with the current environmental data, the at least one processor is further directed to:

determine a first region in the target reference environmental data of the 3D model of the building that corresponds to the un-matched region in the current environmental data; and update the first region in the target reference environmental data of the 3D model of the building based on the un-matched region in the current environmental data to generate the updated 3D model of the building.

7. The system of claim 6, wherein the first region in the 3D model of the building is determined using a perspective-n-point (PNP) method.

8. The system of claim 6, wherein to update the first region in the target reference environmental data of the 3D model of the building based on the un-matched region in the current environmental data, the at least one processor is directed to:

determine a matched region in the current environmental data;

determine a second region in the target reference environmental data of the 3D model of the building that corresponds to the matched region;

register the matched region in the current environmental data with the second region in the 3D model of the building; and register the un-matched region in the current environmental data with the first region in the 3D model of the building, based on the registration of the matched region with the second region, to update the first region of the 3D model of the building.

9. The system of claim 1, wherein the building is enclosed or semi-enclosed, and the image of the building is taken by the user device inside the building.

10. A method implemented on a computing device having at least one storage device storing a set of instructions for updating a model of a building, and at least one processor in communication with the at least one storage device, the method comprising:

obtaining a three-dimensional (3D) model of a building including reference environmental data associated with a plurality of reference locations of the building;

obtaining, from a user device, current environmental data corresponding to a current location of the building;

identifying, from the reference environmental data, target reference environmental data corresponding to the current environmental data, wherein the target reference environmental data includes a highest number of environmental details, among the reference environmental data, that are similar to environmental details in the current environmental data;

identifying, from the 3D model, the reference location that corresponds to the target reference environmental data as a target reference location corresponding to the current location;

comparing the current environmental data with the target reference environmental data;

sending to the user device the target reference location when the current environmental data match the target reference environmental data; and updating the 3D model with the current environmental data when the current environmental data statistically un-match the target reference environmental data, wherein the method further includes:

receiving environmental data of the current location from a plurality of other user devices within a predetermined period of time immediately prior to a current time;

comparing the environmental data of the current location received from the plurality of other user devices with the current environmental data of the current location;

comparing the environmental data of the current location received from the plurality of other user devices with the target reference environmental data; and in response to a determining that the environmental data of the current location received from the plurality of other user devices match with the current environmental data of the current location for more than a third threshold, and the environmental data of the current location received from the plurality of other user devices and the current environmental data of the current location do not match the target reference environmental data for more than a fourth threshold, determining that the current environmental data of the current location statistically un-match the target reference environmental data.

11. A system, comprising:

at least one storage medium including a set of instructions for updating a model of a building;

at least one processor in communication with the at least one storage medium, wherein when executing the set of instructions, the at least one processor is directed to:

obtain a three-dimensional (3D) model of a building including reference environmental data associated with a plurality of reference locations of the building;

receive and accept a connection request from a user device;

detect a customer application executing on the user device, the customer application collecting environmental information of the user device from one or more sensors of the user device and automatically communicating with the system over a network;

communicate with the customer application executing on the user device to receive a positioning request;

obtain, from the customer application of the user device, current environmental data corresponding to a current location of the building based on the environmental information detected by the one or more sensors of the user device;

identify, from the reference environmental data, target reference environmental data corresponding to the current environmental data, wherein the target reference environmental data includes a highest number of environmental details, among the reference environmental data, that are similar to environmental details in the current environmental data;

identify, from the 3D model, the reference location that corresponds to the target reference environmental data as a target reference location corresponding to the current location;

compare the current environmental data with the target reference environmental data;

send to the user device communication signals when the current environmental data match the target reference environmental data, wherein the communication signals is structured to include a command and the target reference location, the command is configured to render the user terminal to generate a presentation of the target reference location on a display of the user device; and update the 3D model with the current environmental data when the current environmental data statistically un-match the target reference environmental data, wherein the at least one processor is further directed to:

receive environmental data of the current location from a plurality of other user devices within a predetermined period of time immediately prior to a current time;

compare the environmental data of the current location received from the plurality of other user devices with the current environmental data of the current location;

compare the environmental data of the current location received from the plurality of other user devices with the target reference environmental data; and in response to a determining that the environmental data of the current location received from the plurality of other user devices match with the current environmental data of the current location for more than a third threshold, and the environmental data of the current location received from the plurality of other user devices and the current environmental data of the current location do not match the target reference environmental data for more than a fourth threshold, determine that the current environmental data of the current location statistically un-match the target reference environmental data.

12. The system of claim 11, wherein the 3D model of the building is a point cloud model or a mesh model, wherein the target reference environmental data includes a plurality of target reference feature points corresponding to environmental details of the target reference location; and the current environmental data includes a plurality of current feature points corresponding to environmental details of the current location.

13. The system of claim 12, wherein to compare the current environmental data with the target reference environmental data, the at least one processor is directed to:

compare the plurality of current feature points with the target reference feature points;

determine the current environmental data match the target reference environmental data when the comparison returns a matching degree greater than a first threshold; and determine the current environmental data un-match the target reference environmental data when the comparison returns the matching degree less than or equal to the first threshold.

14. The system of claim 13, wherein to compare the plurality of current feature points with the plurality of target reference feature points, the at least one processor is further directed to:

match each of the plurality of current feature points with one of the plurality of target reference feature points;

determine a difference between a color or a greyscale value of each of the plurality of current feature points and a color or greyscale value of a matched point in the plurality of target reference feature points; and generate the matching degree between the current environmental data of the building and the target reference environmental data of the 3D model of the building based on the difference.

15. The system of claim 14, wherein after determining that the current environmental data statistically un-match the target reference environmental data the at least one processor is further directed to:

determine a plurality of un-matched feature points, wherein the color or the greyscale value of each of the plurality of un-matched points is different from the color or the greyscale value of the corresponding target reference feature point;

select some or all un-matched feature points from the plurality of un-matched feature points; and determine an un-matched region in the current environmental data based on the selected some or all un-matched feature points.

16. The system of claim 15, wherein to update the 3D model of the building with the current environmental data, the at least one processor is further directed to:

determine a first region in the target reference environmental data of the 3D model of the building that corresponds to the un-matched region in the current environmental data; and update the first region in the target reference environmental data of the 3D model of the building based on the un-matched region in the current environmental data to generate the updated 3D model of the building.

17. The system of claim 16, wherein to update the first region in the target reference environmental data of the 3D model of the building based on the un-matched region in the current environmental data, the at least one processor is directed to:
- determine a matched region in the current environmental data;
- determine a second region in the target reference environmental data of the 3D model of the building that corresponds to the matched region;
- register the matched region in the current environmental data with the second region in the 3D model of the building; and
- register the un-matched region in the current environmental data with the first region in the 3D model of the building, based on the registration of the matched region with the second region, to update the first region of the 3D model of the building.

18. The system of claim 11, wherein the building is enclosed or semi-enclosed, and the image of the building is taken by the user device inside the building.

* * * * *